(12) United States Patent
Toriu et al.

(10) Patent No.: US 10,606,165 B2
(45) Date of Patent: Mar. 31, 2020

(54) MASK PATTERN VERIFICATION METHOD

(71) Applicant: TOSHIBA MEMORY CORPORATION, Minato-ku, Tokyo (JP)

(72) Inventors: Yayori Toriu, Kamakura Kanagawa (JP); Masanari Kajiwara, Yokohama Kanagawa (JP); Fumiharu Nakajima, Yokohama Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/100,122

(22) Filed: Aug. 9, 2018

(65) Prior Publication Data

US 2019/0243232 A1 Aug. 8, 2019

(30) Foreign Application Priority Data

Feb. 8, 2018 (JP) ................. 2018-020959

(51) Int. Cl.
*G06F 17/50* (2006.01)
*G03F 1/36* (2012.01)
(Continued)

(52) U.S. Cl.
CPC .............. *G03F 1/36* (2013.01); *G03F 1/70* (2013.01); *G03F 7/70441* (2013.01); *G06F 17/5081* (2013.01)

(58) Field of Classification Search
CPC ........ G03F 7/705; G03F 1/36; G03F 7/70441; G03F 1/70; G03F 7/70666; G03F 1/84; G03F 1/26; G03F 7/70433; G03F 7/70425; G03F 1/02; G03F 1/20; G03F 1/38; G03F 1/50; G03F 7/70283; G03F 7/7065; G03F 7/70625; G03F 1/44; G06F 17/5081; G06F 17/5009; G06F 17/50; G06F 17/5068; G06F 2217/12; G06F 17/5036; G06F 2217/06; G06F 2217/10; G06F 17/10; G06F 19/00;
(Continued)

(56) References Cited

U.S. PATENT DOCUMENTS 8,407,629 B2 3/2013 Itoh et al.
8,527,914 B2 9/2013 Uno et al.
(Continued)

FOREIGN PATENT DOCUMENTS

JP 2010002772 A 1/2010
JP 2010101714 A 5/2010
(Continued)

*Primary Examiner* — Binh C Tat
(74) *Attorney, Agent, or Firm* — Holtz, Holtz & Volek PC

(57) ABSTRACT

According to one embodiment, a mask pattern verification method includes: calculating mask pattern data; calculating an optical image and a resist image; calculating a first feature amount and a second feature amount, using a plurality of algorithms; in each of the plurality of algorithms, comparing the first feature amount with a first threshold, and detecting a critical point candidate in a first pattern; in each of the plurality of algorithms, comparing the second feature amount with a second threshold, and detecting a critical point in the first pattern; and selecting at least one of the plurality of algorithms, and displaying a detection result of the critical point corresponding to a selected algorithm.

16 Claims, 20 Drawing Sheets

(51) Int. Cl.
*G03F 7/20* (2006.01)
*G03F 1/70* (2012.01)

(58) Field of Classification Search
CPC ............ G06F 2217/08; G06F 2217/14; G06F 17/5022; G06F 2217/84; G06T 2207/10056; G06T 2207/10144
USPC ...................................................... 716/50–56
See application file for complete search history.

(56) References Cited

U.S. PATENT DOCUMENTS

| | | |
|---|---|---|
| 8,612,899 B2 | 12/2013 | Miloslavsky et al. |
| 2010/0067777 A1 | 3/2010 | Kodera et al. |
| 2010/0162197 A1* | 6/2010 | Ye .......................... G03F 1/144 716/53 |
| 2012/0117522 A1* | 5/2012 | Feng .......................... G03F 1/70 716/54 |
| 2013/0111416 A1 | 5/2013 | Nakagawa et al. |
| 2014/0059502 A1 | 2/2014 | Miyoshi et al. |
| 2015/0054940 A1* | 2/2015 | Shi .......................... G06T 7/001 348/87 |

FOREIGN PATENT DOCUMENTS

| | | |
|---|---|---|
| JP | 4843649 B2 | 12/2011 |
| JP | 2013097267 A | 5/2013 |
| JP | 2013125906 A | 6/2013 |
| JP | 5917337 B2 | 5/2016 |

* cited by examiner

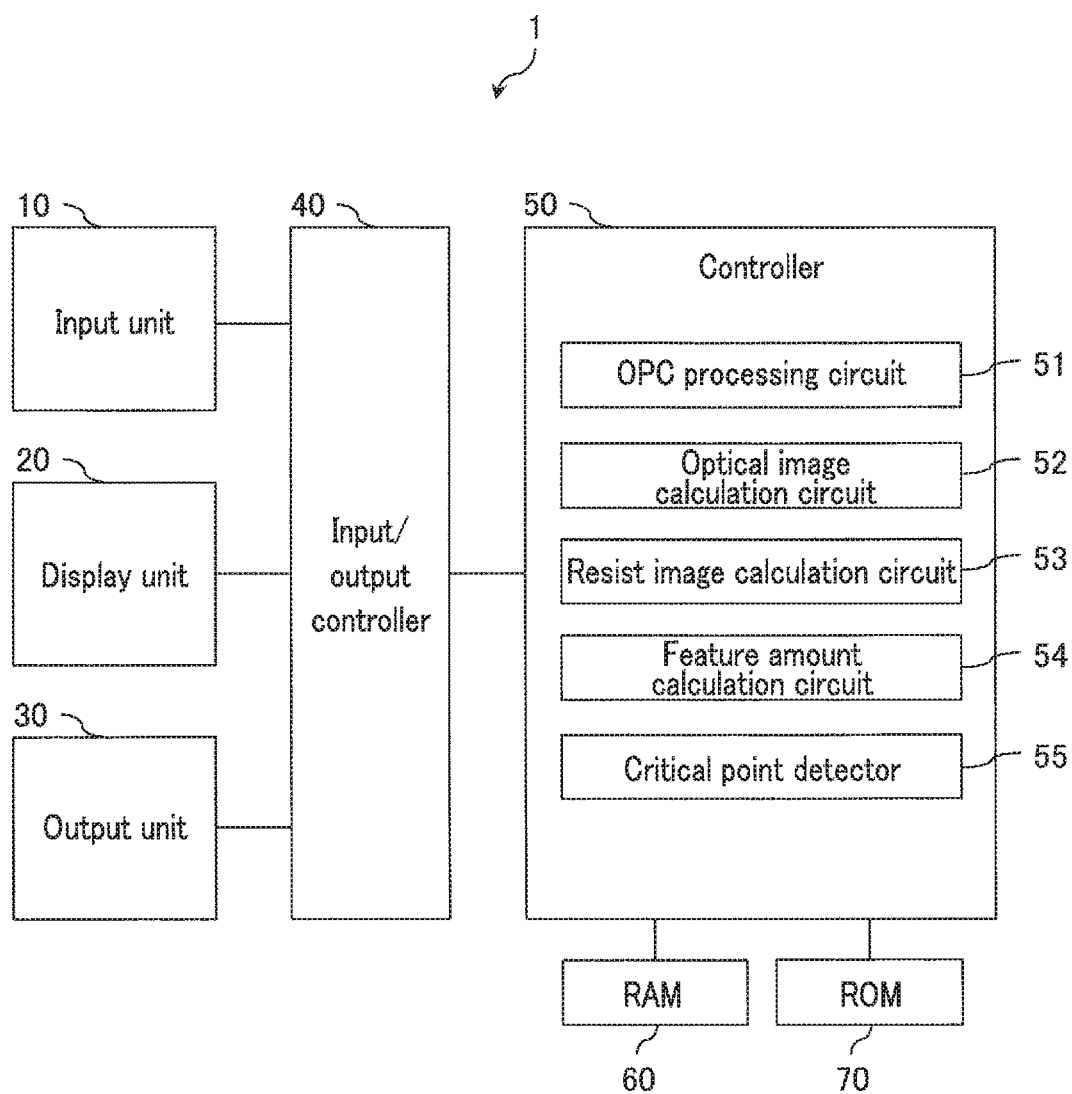
F I G. 1

First feature amount calculation

Second feature amount calculation

MASK PATTERN VERIFICATION METHOD

CROSS-REFERENCE TO RELATED APPLICATIONS

This application is based upon and claims the benefit of priority from Japanese Patent Application No. 2018-020959, filed Feb. 8, 2018, the entire contents of which are incorporated herein by reference.

FIELD

Embodiments described herein relate generally to a mask pattern verification method.

BACKGROUND

When designing a mask for a semiconductor integrated circuit, a mask pattern is calculated based on circuit pattern data and optical proximity correction (OPC) processing, and the mask pattern is verified using a lithography compliance check (LCC), etc. This allows detecting critical points of mask pattern data, that is, detecting portions where resist pattern formation defects are highly likely to occur when performing exposure using a mask that is manufacture based on the mask pattern data. The circuit pattern data or OPC conditions are then revised.

BRIEF DESCRIPTION OF THE DRAWINGS

FIG. 1 is a block diagram of a mask pattern verification device used for a mask pattern verification method according to a first embodiment;

DETAILED DESCRIPTION

Figure 2:
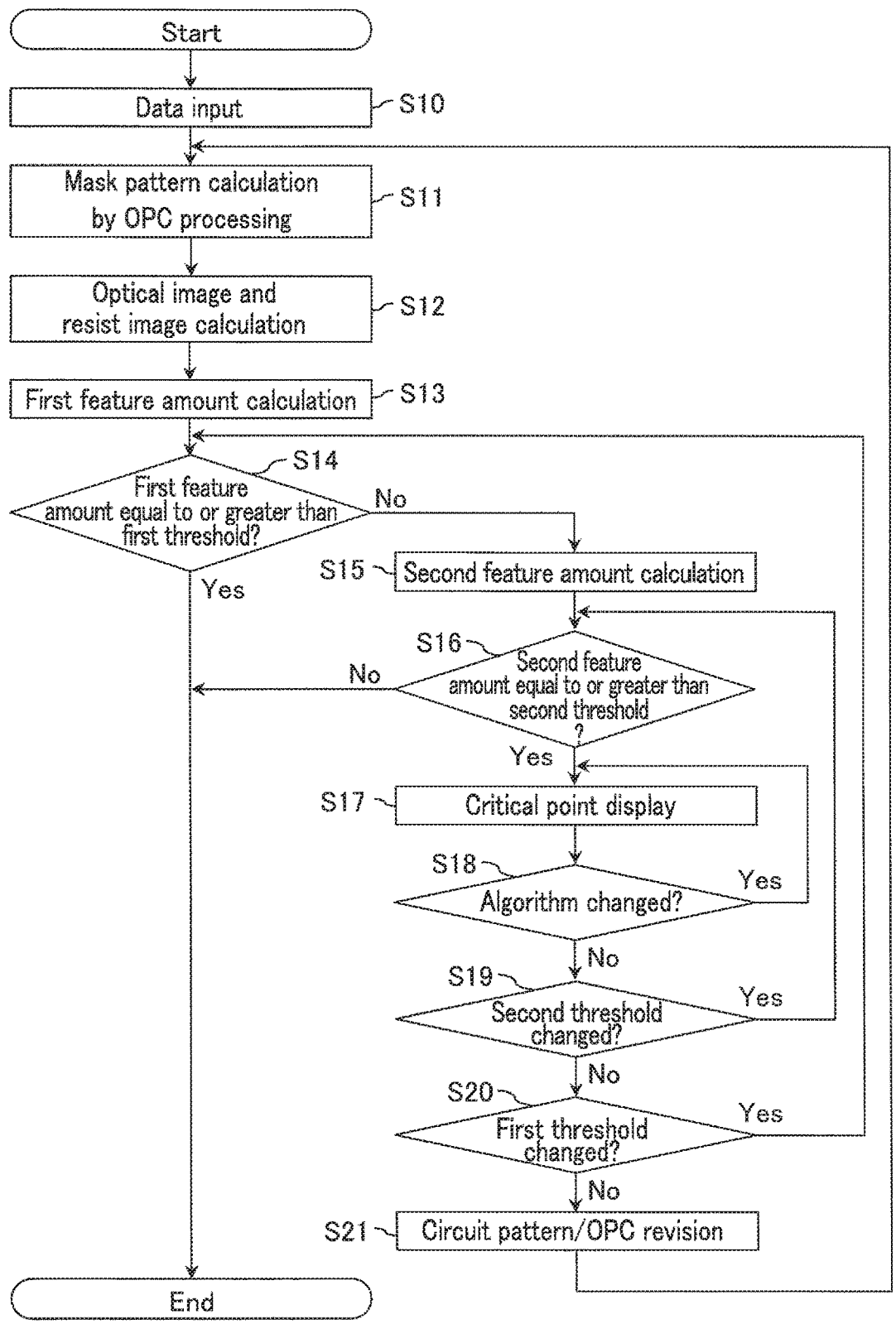
FIG. 2 is a flowchart of a verification operation in the mask pattern verification method according to the first embodiment.

In general, according to one embodiment, a mask pattern verification method includes: calculating mask pattern data based on circuit pattern data and OPC processing; calculating an optical image and a resist image based on the mask pattern data; calculating a first feature amount regarding a first pattern of the resist image and a second feature amount regarding the first pattern and a second pattern that is adjacent to the first pattern respectively, using a plurality of algorithms; in each of the plurality of algorithms, comparing the first feature amount with a first threshold, and detecting a critical point candidate in the first pattern; in each of the plurality of algorithms, comparing the second feature amount with a second threshold, and detecting a critical point in the first pattern; and selecting at least one of the plurality of algorithms, and displaying a detection result of the critical point corresponding to a selected algorithm.

1. First Embodiment

A mask pattern verification method and a program thereof according to a first embodiment will be described.

1.1 Overall Configuration of Mask Pattern Verification Device

First, an overall configuration of a mask pattern verification device will be described using FIG. 1.

As shown in FIG. 1, a mask pattern verification device 1 includes an input unit 10, a display unit 20, an output unit 30, an input/output controller 40, a controller 50, a random access memory (RAM) 60, and a read only memory (ROM) 70.

The input unit 10 includes a keyboard and a mouse, etc. for a user to input data, etc. Furthermore, the input unit 10 includes an input circuit. The input circuit executes interface processing when inputting circuit pattern data and OPC conditions, etc. from external equipment (circuit design devices or external databases, etc.). For example, in the case where data is input from external equipment by wireless communications, the mask pattern verification device 1 is provided with a communication unit including an antenna (not shown), and the input circuit is connected to the communication unit.

The display unit 20 is used to report a processing result obtained by the controller 50 to a user, and includes a display (a liquid crystal monitor, etc.).

The output unit 30 includes an output circuit for outputting the processing result obtained by the controller 50 to the external equipment. The output circuit executes interface processing when outputting data to the external equipment. For example, in the case of outputting data to the external equipment by wireless communications, the output circuit is connected to the communication unit. Furthermore, the output unit 30 may, for example, include a printer for outputting the processing result obtained by the controller 50.

The input/output controller 40 executes interface processing between the input unit 10, the display unit 20, and the output unit 30, and the controller 50.

The RAM 60 temporarily stores input data and data generated at the time of mask pattern verification. The input data includes circuit pattern data, optical proximity correction (OPC) conditions, exposure conditions (exposure amount, exposure wavelength, and numerical aperture (NA), etc.), process conditions (ground structure and resist conditions, etc.), and data input by a user, etc.

The ROM 70 is a storage medium in which a program for realizing the mask pattern verification is stored. The controller 50 executes computing processing based on the program stored in the ROM 70 to perform mask pattern verification.

The controller 50 is configured by, for example, a central processing unit (CPU), and controls the entire mask pattern verification device 1. The controller 50 includes an OPC processing circuit 51, an optical image calculation circuit 52, a resist image calculation circuit 53, feature amount calculation circuit 54, and a critical point detector 55.

The OPC processing circuit 51 performs OPC processing of the circuit pattern data, and calculates a mask pattern.

The optical image calculation circuit 52 calculates an optical image based on the mask pattern and the exposure conditions, etc.

The resist image calculation circuit 53 calculates a resist image based on mask pattern data, optical image data, and process conditions, etc. using, for example, an acid diffusion model. The calculated resist image is displayed, for example, on the display unit 20.

The feature amount calculation circuit 54 calculates first and second feature amounts respectively, using a plurality of algorithms in a calculation region set by a user inside a mask pattern verification region (hereinafter, merely referred to as "verification region") that is selected in advance by the user. The verification region and the calculation region can be set optionally by the user. For example, as the calculation region, an optical radius, that is, a size approximately ten times an exposure wavelength, may be set. The feature amount calculation circuit 54 includes four algorithms corresponding to a critical dimension (CD) value of an optical image intensity distribution on a wafer, a normalized image log slope (NILS) value, a peak value, and an integrated intensity value of the optical image intensity distribution. The feature amount calculation circuit 54 calculates the first and the second feature amounts respectively with respect to the four algorithms.

The CD value indicates a width of the optical image intensity distribution in any light intensity $I_o$. The light intensity $I_o$ indicates a light intensity in a slice level of the resist image. The exposure amount is adjusted so that the dimension of the resist image becomes a target dimension. The light intensity at this time is set as $I_o$. Accordingly, for example, the CD value at the light intensity $I_o$, is defined as a resist width. The NILS value is a value obtained by standardizing a tilt of the optical image intensity distribution in the light intensity $I_o$ by the CD value. The NILS value indicates a contrast of light intensity. As the NILS value increases, the resist image is more easily resolved. That is, trailing may be easily reduced on the cross-sectional surface of the resist image. The integrated intensity value is a value obtained by integrating an optical image intensity that is equal to or higher than the light intensity $I_o$, and standardizing it by an area based on the CD value.

The first feature amount indicates a feature amount regarding a selected resist pattern shape (hereinafter referred to as "selected pattern") of the resist image, and the second feature amount indicates the size of a feature amount of an adjacent pattern. Hereinafter, in the present embodiment, as the second feature amount, an absolute, value of the first feature amount in the adjacent pattern will be presented. It should be noted that the second feature amount is not limited to the absolute value of the first feature amount in the adjacent pattern. For example, this may be the magnitude of a sum, a subtraction (difference), a multiplication, or a division between the first feature amount of the selected pattern and the first feature amount of the adjacent pattern.

It should be noted that the algorithms included in the feature amount calculation circuit 54 are not limited to the four algorithms corresponding to the CD value, the NILS value, the peak value, and the integrated intensity value. The feature amount calculation circuit 54 needs to include at least one algorithm among the four algorithms, or may include other algorithms. For example, in addition to a general metric of a mask error enhancement factor (MEEF), an image log slope (ILS), a contrast, a process variation (PV) band, or a light intensity of an average image, at least one of the algorithms that corresponds to a light intensity at each resist height may be included.

The critical point detector determines and detects a critical point by using the first and the second feature amounts that are calculated by using the four algorithms corresponding to the CD value, the NILS value, the peak value, and the integrated intensity value. That is, the critical point detector 55 uses four detection methods to detect the critical point in each detection method. More specifically, the critical point detector 55 determines each of the first and the second feature amounts corresponding to each of the CD value, the NILS value, the peak value, and the integrated intensity value based on first and second thresholds, and detects a critical point candidate and a critical point. The first threshold is a threshold for determining the first feature amount. The critical point detector 55 detects a selected pattern with a first feature amount that is smaller than the first threshold as the critical point candidate. In the same manner, the second threshold is a threshold for determining the second feature amount. The critical point detector 55 detects a selected pattern with a second feature amount that is equal to or greater than the second threshold as the critical point with respect to the critical point candidate. The critical point candidate indicates a selected pattern that has a possibility of being detected as the critical point. The critical point indicates poor exposure, that is, a selected pattern that is highly possible of having poor pattern formation. The first and the second thresholds are set, respectively, corresponding to each of the CD value, the NILS value, the peak value, and the integrated intensity value. For example, the first and the second thresholds may be values obtained by experience based on the verification result of the other mask patterns and resist patterns exposed by using the mask patterns.

1.2 Mask Pattern Verification Method

Now, the mask pattern verification method will be described using FIG. 2.

As shown in FIG. 2, data regarding a mask pattern to be verified is input to the mask pattern verification device 1 via the input unit 10 (step S10). More specifically, the input data includes, for example, the circuit pattern data, the OPC conditions, the exposure conditions, the process conditions, the light intensity $I_o$, and the first and the second thresholds, etc. The input data is stored in the RAM 60. For example, the circuit pattern data and the OPC conditions are input from external equipment via the input circuit of the input unit 10, and the exposure conditions, the process conditions, the light intensity $I_o$, and the first and the second thresholds, etc. are input by a keyboard operation of a user. Furthermore, for example, values that are stored in the RAM 50 and were used when performing previous mask pattern verifications may also be used for the light intensity $I_o$ and the first and the second thresholds, etc.

The OPC processing circuit, 51 then executes OPC processing based on the circuit pattern data and the OPC conditions, etc. to calculate the mask pattern (step S11). Data of the calculated mask pattern is stored in the RAM 60.

Then, the controller 50 calculates the optical image and the resist image (step S12). More specifically, first, the optical image calculation circuit 52 calculates the optical image based on the mask pattern and the exposure conditions, etc. Then, the resist image calculation circuit 53 calculates the resist image based on the optical image and the process conditions, etc. Data of the calculated optical image and the resist image is stored in the RAM 60. It should be noted that the controller 50 may also display the optical image or the resist image on the display unit 20. For example, a user sets a calculation region with reference to the resist image displayed on the display unit 20.

The feature amount calculation circuit 54 then calculates the first feature amount in each algorithm in the set calculation region (step S13). More specifically, the feature amount calculation circuit 54 calculates the first feature amount based on the algorithm corresponding to the CD value, the first feature amount based on the algorithm corresponding to the NILS value, the first feature amount based on the algorithm corresponding to the peak value, and the first feature amount based on the algorithm corresponding to the integrated intensity value.

Next, the critical point detector 55 compares the first feature amount and the first threshold for every algorithm, and detects the critical point candidate (step S14).

In the case where the first feature amounts based on the four algorithms are equal to or greater than the first threshold (step S14_Yes), the critical point detector 55 determines that there are no critical points in the calculation region, that is, there is no error in the mask pattern. The controller 50, for example, displays the detection result on the display unit 20, and ends the verification of the mask pattern in the selected calculation region. In the case of continuing the verification of the mask pattern in a different calculation region, the process returns to step S13, and the first feature amount is calculated in a different calculation region.

In the case where the first feature amount based on at least one algorithm is smaller than the first threshold (step S14_No), the feature amount calculation circuit 54 detects such corresponding selected pattern as the critical point candidate. The feature amount calculation circuit 54 calculates the second feature amount by using a corresponding algorithm with respect to the detected critical point candidate, that is, the first feature amount (step S15).

The critical point detector 55 then compares the second feature amount and the second threshold, and detects the critical point (step S16).

In the case where the second feature amount is smaller than the second, threshold (step S16_No), the critical point detector 55 determines that there are no critical points in the calculation region. The controller 50 displays the detection result on the display unit 20, and ends the verification of the mask pattern in the selected calculation region. For example, the verified mask pattern data is output to the external equipment via the output unit 30, and the mask is manufactured based on this mask pattern data. It should be noted that the controller 50 may also display the resist image of the calculation region and the critical point candidate corresponding to the first feature amount that is smaller than the first threshold on the display unit 20.

In the case where the second feature amount is equal to or greater than the second threshold (step S16_Yes), the critical point detector 55 detects such portion as the critical point.

The controller 50 displays the critical point on the display unit 20 (step S17). More specifically, when the user selects one or a plurality of algorithms based on the display of the display unit 20, the controller 50 displays on the display unit 20 the resist image of the calculation region and one or a plurality of algorithms selected by the user, that is, the critical point corresponding to the selected detection method. The user confirms absence/presence of the critical point by the display of the display unit 20.

The user may change the selected algorithm (step S18). In the case where the algorithm is changed by the user (step S18_Yes), the controller 50 returns to step S17, and displays a critical point that corresponds to the changed algorithm on the display unit 20. In the case where the algorithm is not changed by the user (steps S18_No), the display state is maintained based on the selected algorithm.

The user may also change the second threshold (step S19). In the case where the second threshold is changed by the user (step S19_Yes), the controller 50 returns to step S16, and the determination of the second feature amount and the detection of the critical point are performed again based on the changed second threshold. In the case where the second threshold is not changed by the user (steps S19_No), the display state is maintained based on the selected second threshold.

The user may also change the first threshold (step S20). In the case where the first threshold is changed by the user (step S20_Yes), the controller 50 returns to step S14, and the determination of the first feature amount and the detection of the critical point candidate are performed again based on the changed first threshold. In the case where the first threshold is not changed by the user (steps S20_No), the display state is maintained based on the selected first threshold.

In order to eliminate the critical point, the user revises the circuit pattern data or the OPC conditions (step S21). In the following, a case in which the circuit pattern data or the OPC conditions are revisable by the mask pattern verification device 1 will be presented. For example, in the case where the OPC conditions are revised by the user, the process returns to step S11, and the OPC processing circuit 51 executes the OPC processing again based on the revised OPC conditions. Furthermore, for example, in the case where the user has revised the circuit pattern data, the controller 50 confirms whether or not the revised circuit pattern data has not violated a design rule check (DRC). If not violated, the circuit pattern data stored in the RAM 60 is updated. Then, the process returns to step S11, and the OPC processing circuit 51 executes the OPC processing of the updated circuit pattern data. The updated circuit, pattern data and OPC data (OPC conditions) are output to the external equipment via the output unit 30.

It should be noted that in the example of FIG. 2, a case in which the second feature amount is calculated only for the selected pattern that is detected as the critical point candidate has been described; however, the second feature amount may be calculated for all of the selected patterns. In this case, the first and the second feature amounts are calculated, for example, in step S13, and step S15 is abolished.

Furthermore, the mask pattern verification device 1 does not have to have a revision function of the circuit pattern data or the OPC conditions. In this case, the process returns to step S10, and the circuit pattern data or the OPC data revised at an external circuit design device is input to the input unit 10.

Figure 3:
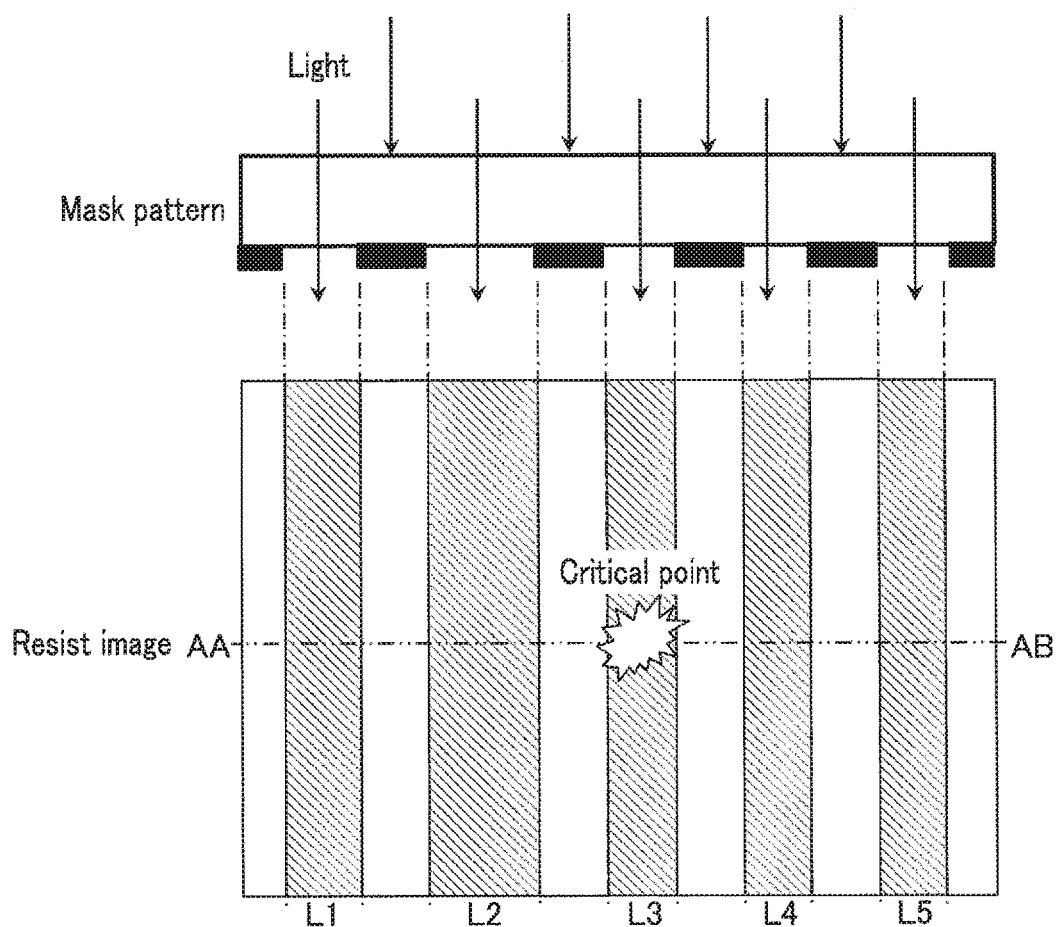
FIG. 3 is an example diagram of a mask pattern and a resist image.

1.3 Algorithms Corresponding to CD Value, NILS Value, Peak Value, and Integrated Intensity Value Now, algorithms corresponding to the CD value, the NILS value, the peak value, and the integrated intensity value will be described. FIG. 3 is an example diagram showing a side surface of a mask pattern and an upper surface of the resist image corresponding thereto. In the example of FIG. 3, five interconnects L1 to L5 are formed on portions exposed to light via the mask pattern. FIG. 3 shows a case in which, as a result of verifying the mask pattern taken along line AA-AB of the resist image, there is a critical point on the interconnect L3. In the following, a case in which the algorithms corresponding to the CD value, the NILS value, the peak value, and the integrated intensity value are applied along line AA-AB will be described, respectively. It should be noted that Line AA-AB is a virtual line for the mask pattern verification, and can be set in any direction.

1.3.1 Algorithm Corresponding to CD Value

Figure 4:
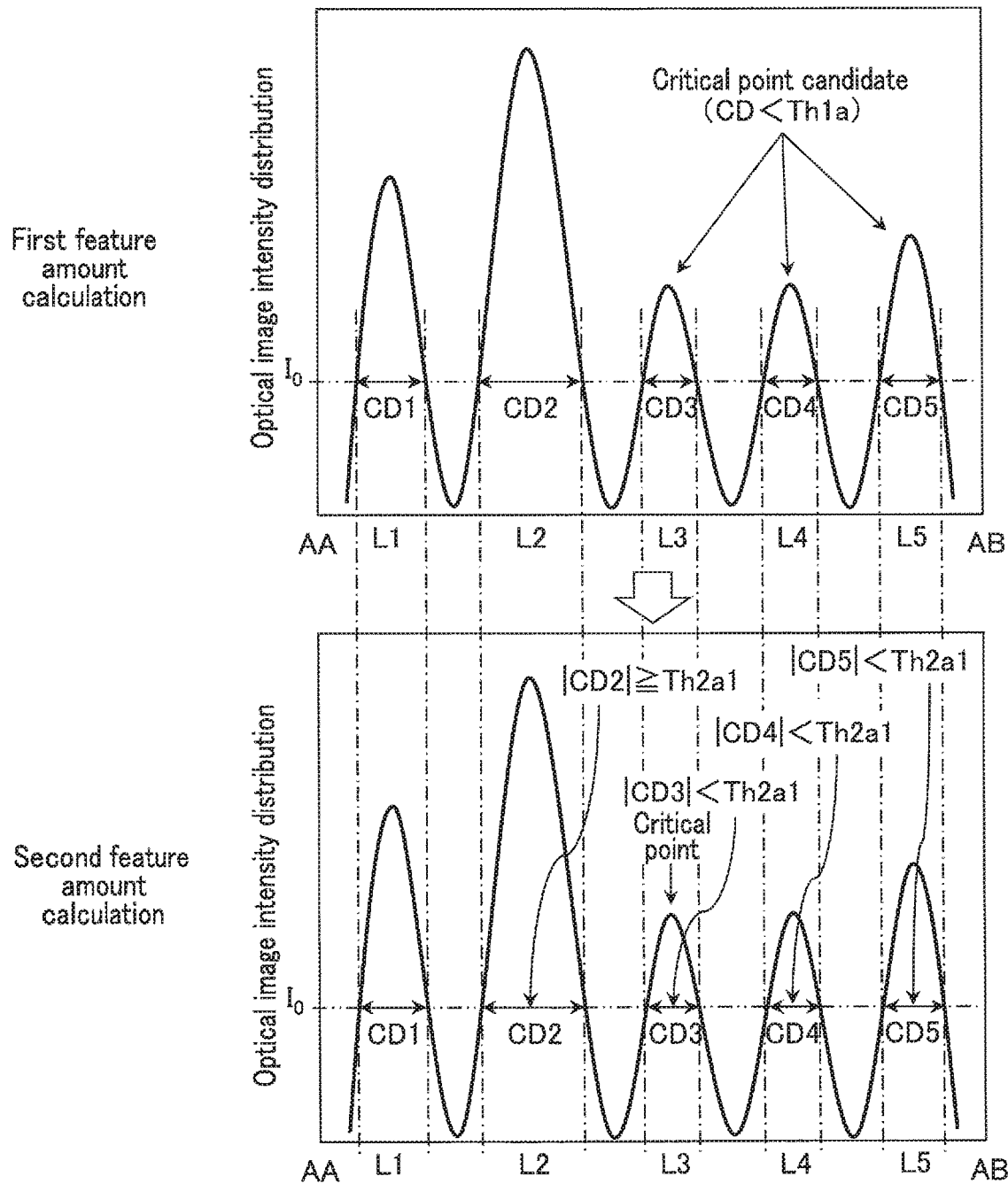
FIG. 4 is a diagram showing first and second feature amounts based on a CD value in the mask pattern verification method according to the first embodiment.

First, a case in which an algorithm corresponding to the CD value is applied will be described using FIG. 4. FIG. 4 shows an optical image intensity distribution on a wafer taken along line AA-AB. The upper graph in FIG. 4 shows the first feature amount based on the CD value, and the lower graph in FIG. 4 shows the second feature amount calculated by using the first feature amount.

As shown in the upper graph of FIG. 4, in the optical image intensity distribution taken along line AA-AB, each of the CD values corresponding to the interconnects L1 to L5 is depicted, respectively, as CD1 to CD5. The first threshold of the CD value is depicted as Th$1a$. In the upper graph of FIG. 4, CD values CD3, CD4, and CD5 are smaller than the first threshold. Th$1a$ of the CD value, and the interconnects L3 to L5 are detected as the critical point candidates.

As shown in the lower graph of FIG. 4, the second feature amount is obtained for the CD values CD3, CD4, and CD5. More specifically, regarding the interconnects that are regarded as the critical point candidates, in the case where the magnitude of an absolute value of the CD value of an adjacent interconnect is equal to or greater than a second threshold Th$2a1$ of the CD value, such corresponding interconnect, that is, the selected pattern, is detected as the critical point. For example, when focusing on the interconnect L3, and comparing the magnitude of the absolute value of the CD value CD2 of the interconnect L2 that is adjacent to one side of the interconnect L3 and the second threshold Th$2a1$ of the CD value, a relationship of $|CD2| \geq Th2a1$ is established. Accordingly, the interconnect L3 is detected as the critical point. Furthermore, for example, when focusing on the interconnect L4, and comparing an absolute value $|CD3|$ of the CD value CD3 of the adjacent interconnect L3 and the second threshold Th$2a1$ of the CD value, a relationship of $|CD3| < Th2a1$ is established. Furthermore, when comparing an absolute value $|CD5|$ of the CD value CD5 of the adjacent interconnect L5 and the second threshold Th$2a1$ of the CD value, a relationship of $|CD5| < Th2a1$ is established. Accordingly, the interconnect L4 is not detected as the critical point. Furthermore, when focusing on the interconnect L5, and comparing an absolute value CD4 of the CD value CD4 of the adjacent interconnect L4 and the second threshold Th$2a1$ of the CD value, a relationship of $|CD4| < Th2a1$ is established. Accordingly, the interconnect L5 is also not detected as the critical point.

It should be noted that the magnitude of a sum, a reduction, a multiplication, or a division between the CD value of the selected pattern and the CD value of the adjacent pattern may be set as the second feature amount, and compared to the appropriately set second threshold.

1.3.2 Algorithm Corresponding to NILS Value

Figure 5:
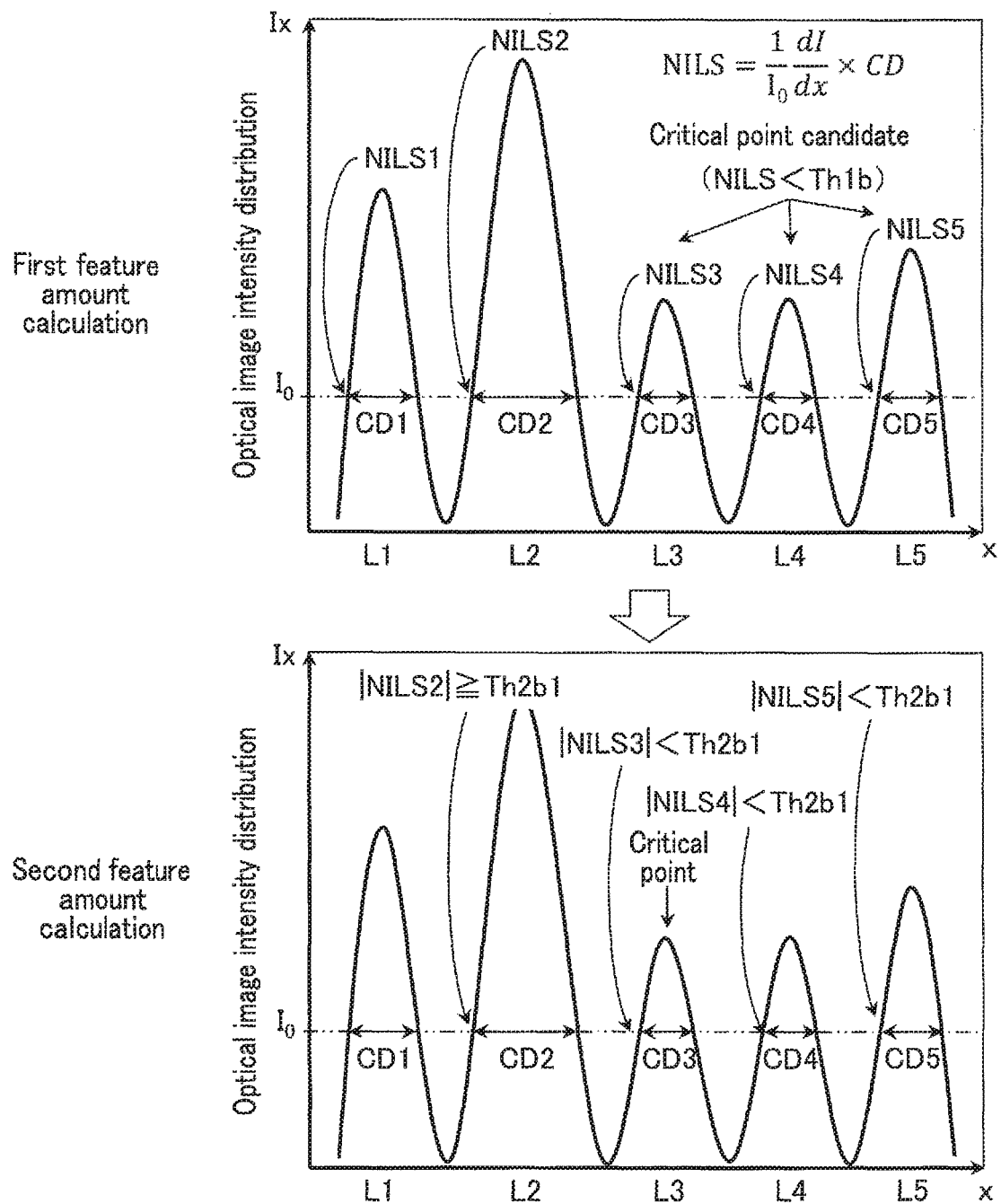
FIG. 5 is a diagram showing first and second feature amounts based on a NILS value in the mask pattern verification method according to the first embodiment.

Now, a case in which an algorithm corresponding to the NILS value is applied will be described using FIG. 5. FIG. 5 shows an optical image intensity distribution on a wafer taken along line AA-AB. The upper graph in FIG. 5 shows the first feature amount based on the NILS value, and the lower graph in FIG. 5 shows the second feature amount calculated by using the first feature amount.

As shown in the upper graph of FIG. 5, in the optical image intensity distribution taken along line AA-AB, each of the CD values corresponding to the interconnects L1 to L5 is depicted, respectively, as CD1 to CD5, and each of the NILS values corresponding to the interconnects L1 to L5 is depicted, respectively, as NILS1 to NILS5. More specifically, in the interconnect L1, for example, when the tilt of the optical image intensity distribution in the light intensity $I_o$ is depicted as $dI1/dx$, the NILS1 is obtained by the following formula.

$$NILS1 = (1/I_o) \times (dI1/dx) \times CD1$$

Similarly, in the interconnects L2 to L5, when the tilt of the optical image intensity distribution in the light intensity $I_o$ is depicted respectively as $dI2/dx$ to $dI5/dx$, NILS2 to NILS5 are obtained by the following formulas.

$$NILS2 = (1/I_o) \times (dI2/dx) \times CD2$$

$$NILS3 = (1/I_o) \times (dI3/dx) \times CD3$$

$$NILS4 = (1/I_o) \times (dI4/dx) \times CD4$$

$$NILS5 = (1/I_o) \times (dI5/dx) \times CD5$$

When the first threshold of the NILS value is depicted as Th$1b$, in the upper graph of FIG. 5, the NILS values NILS3, NILS4, and NILS5 are smaller than the first threshold Th$1b$ of the NILS value, and the interconnects L3 to L5 are detected as the critical point candidates.

As shown in the lower graph of FIG. 5, the second feature amount is obtained for the NILS values NILS3, NILS4, and NILS5. More specifically, regarding the interconnects that are regarded as the critical point candidates, in the case where the magnitude of an absolute value of the NILS value of an adjacent interconnect is equal to or greater than a second threshold Th2$b$1 of the NILS value, such corresponding interconnect, that is, the selected pattern, is detected as the critical point. For example, when focusing or the interconnect L3, and comparing the magnitude of the absolute value of the NILS value NILS2 of the interconnect L2 that is adjacent to one side of the interconnect L3 and the second threshold Th2$b$1 of the NILS value, a relationship of |NILS2|≥Th2$b$1 is established. Accordingly, the interconnect L3 is detected as the critical point. When focusing on the interconnect L4, for example, and comparing an absolute value |NILS3| of the NILS value NILS3 of the adjacent interconnect L3 and the second threshold Th2$b$1 of the NILS value, a relationship of |NILS3|<Th2$b$1 is established. Furthermore, when comparing an absolute value |NILS5| of the NILS value NILS5 of the adjacent interconnect L5 and the second threshold Th2$b$1 of the NILS value, a relationship of |NILS5|<Th2$b$1 is established. Accordingly, the interconnect L4 is not detected as the critical point. Furthermore, when focusing on the interconnect L5, and comparing an absolute value |NILS4| of the NILS value NILS4 of the adjacent interconnect L4 and the second threshold Th2$b$1 of the NILS value, a relationship of |NILS4|<Th2$b$1 is established. Accordingly, the interconnect L5 is also not detected as the critical point.

It should be noted that the magnitude of a sum, a reduction, a multiplication, or a division between the NILS value of the selected pattern and the NILS value of the adjacent pattern may be set as the second feature amount, and compared to the appropriately set second threshold.

1.3.3 Algorithm Corresponding to Peak Value

Figure 6:
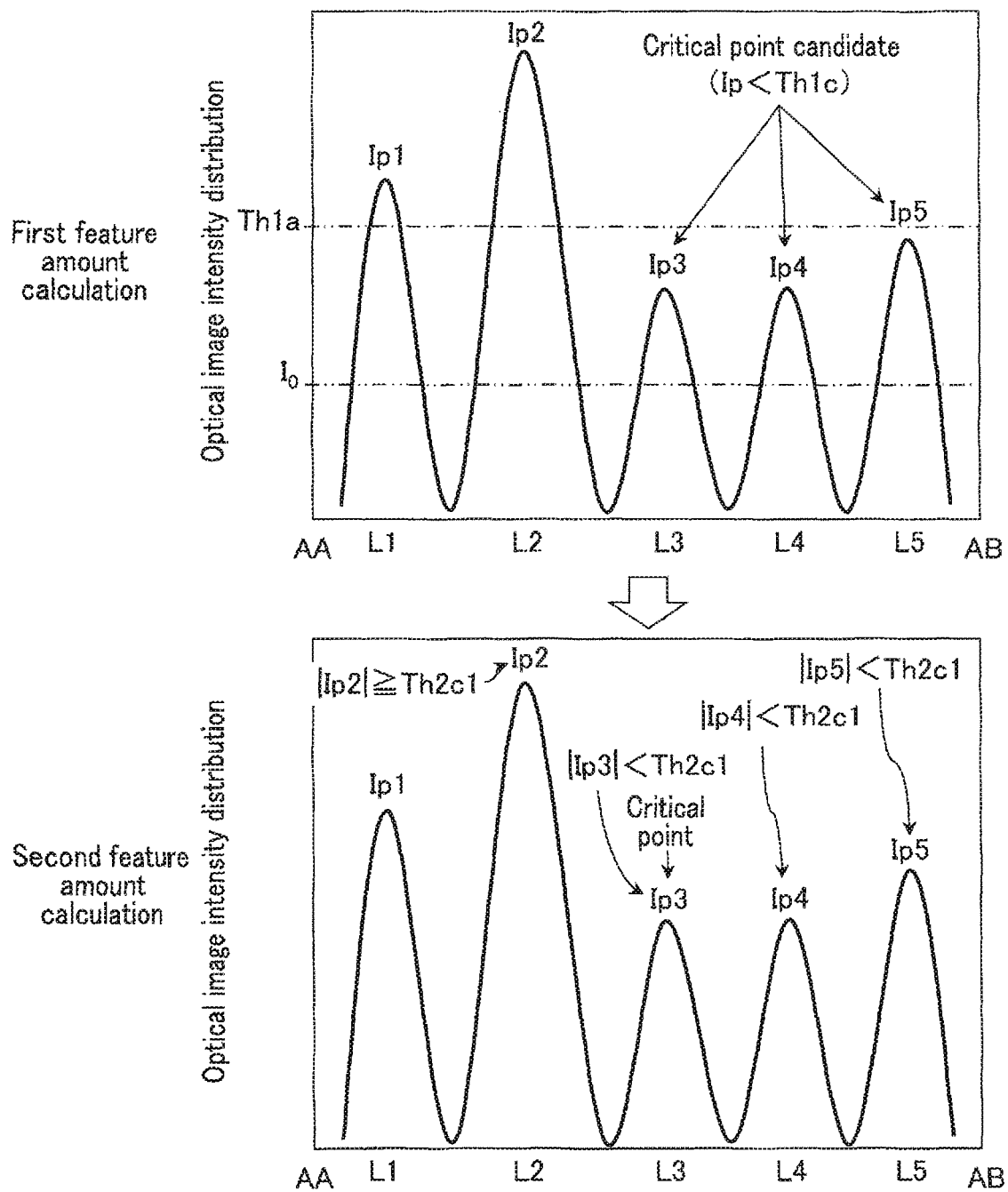
FIG. 6 is a diagram showing first and second feature amounts based on a peak value in the mask pattern verification method according to the first embodiment.

Now, a case in which an algorithm corresponding to the peak value is applied will be described using FIG. 6. FIG. 6 shows an optical image intensity distribution on a wafer taken along line AA-AB. The upper graph in FIG. 6 shows the first feature amount based on the peak value, and the lower graph in FIG. 6 shows the second feature amount calculated by using the first feature amount.

As shown in the upper graph of FIG. 6, in the optical image intensity distribution taken along line AA-AB, each of the peak values corresponding to the interconnects L1 to L5 is depicted, respectively, as Ip1 to Ip5. A value increased by a preset rate with respect to the light intensity $I_o$ is depicted as a first threshold Th1$c$ of the peak value. In the upper graph of FIG. 6, the peak values Ip3, Ip4, and re smaller than the first threshold Th1$c$ of the peak value, and the interconnects L3 to L5 are detected as the critical point candidates.

As shown in the lower graph of FIG. 6, the second feature, amount is obtained for the peak values Ip3, Ip4, and Ip5. More specifically, regarding the interconnects that are regarded as the critical point candidates, in the case where the magnitude of an absolute value of the peak value of an adjacent interconnect is equal to or greater than a second threshold Th2$c$1 of the peak value, such corresponding interconnect, that is, the selected pattern, is detected as the critical point. For example, when focusing on the interconnect L3, and comparing the magnitude of the absolute value of the peak value Ip2 of the interconnect L2 that is adjacent to one side of the interconnect L3 and the second threshold Th2$c$1 of the peak value, a relationship of |Ip2|Th2$c$1 is established. Accordingly, the interconnect L3 is detected as the critical point. Also, for example, when focusing on the interconnect L4, and comparing an absolute value |Ip3| of the peak value Ip3 of the adjacent interconnect L3 and the second threshold Th2$c$1 of the peak value, a relationship of |Ip3|<Th2$c$1 is established. Furthermore, when comparing an absolute value |Ip5| of the peak value Ip5 of the adjacent interconnect L5 and the second threshold Th2$c$1 of the peak value, a relationship of |Ip5|<Th2$c$1 is established. Therefore, the interconnect L4 is not detected as the critical point. Furthermore, when focusing on the interconnect L5, and comparing an absolute value |Ip4| of the peak value Ip4 of the adjacent interconnect L4 and the second threshold Th2$c$1 of the peak value, a relationship of |Ip4|<Th2$c$1 is established. Accordingly, the interconnect L5 is also not detected as the critical point.

It should be noted that the magnitude of a sum, a reduction, a multiplication, or a division between the peak value of the selected pattern and the peak value of the adjacent pattern may be set as the second feature amount, and compared to the appropriately set second threshold.

1.3.4 Algorithm Corresponding to Integrated Intensity Value

Figure 7:
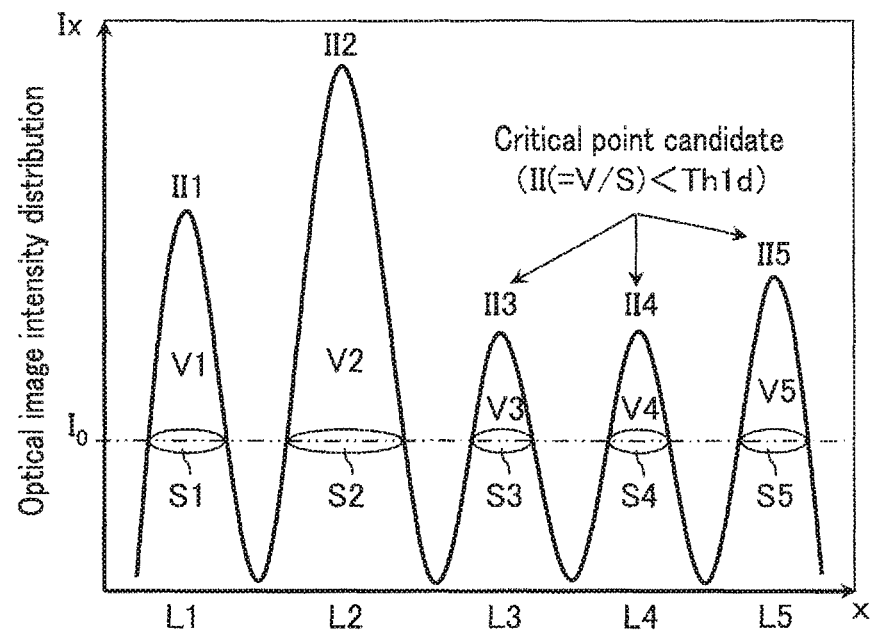
FIG. 7 is a diagram showing first and second feature amounts based on an integrated intensity value in the mask pattern verification method according to the first embodiment.
Figure 7:
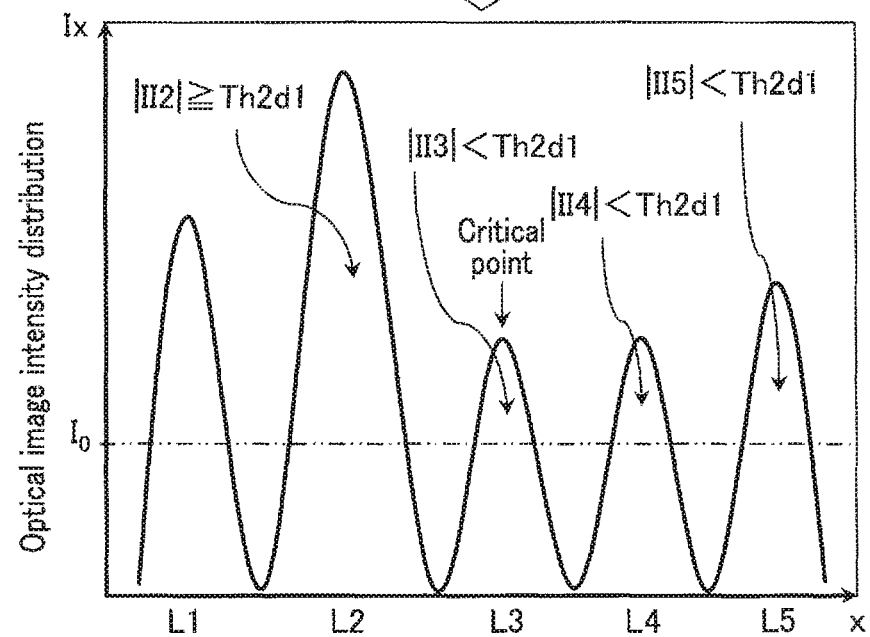

Now, a case in which an algorithm corresponding to the integrated intensity value is applied will be described using FIG. 7. FIG. 7 shows an optical image intensity distribution on a wafer taken along line AA-AB. The upper graph in FIG. 7 shows the first feature amount based on the integrated intensity value, and the lower graph in FIG. 7 shows the second feature amount calculated by using the first feature amount.

As shown in the upper graph of FIG. 7, in the optical image intensity distribution taken along line AA-AB, each area based on the CD values CD1 to CD5 corresponding to the interconnects L1 to L5 is depicted, respectively, as S1 to S5, and each of the integrated values of the optical image intensity distribution on the areas S1 to S5 is depicted, respectively, as V1 to V5. Furthermore, each of the integrated intensity values corresponding to the interconnects L1 to L5 is depicted, respectively, as II1 to II5. Then, for example, the area S1, the integrated value V1, and the integrated intensity value establish a relationship of II1=V1/S1. In the same manner, the integrated intensity values II2 to II5 also establish relationships of II2=V2/S2, II3=V3/S3, II4=V4/S4, and II5=V5/S5. When the first threshold of the integrated intensity value is depicted as Th1$d$, in the upper graph of FIG. 7, the integrated intensity values II3, II4, and II5 are smaller than the first threshold Th1$d$ of the integrated intensity value, and the interconnects L3 to L5 are detected as the critical point candidates.

As shown in the lower graph of FIG. 7, the second feature amount is obtained for the integrated intensity values II3, II4, and II5. More specifically, regarding the interconnects that are regarded as the critical point candidates, in the case where the magnitude of an absolute value of the integrated intensity value of an adjacent interconnect is equal to or greater than a second threshold Th2$d$1 of the integrated intensity value, such corresponding interconnect, that is, the selected pattern, is detected as the critical point. For example, when focusing on the interconnect L3, and comparing the magnitude of the absolute value of the integrated intensity value II2 of the interconnect L2 that is adjacent to one side of the interconnect L3 and the second threshold Th2$d$1 of the integrated intensity value, a relationship of |II2|≥Th2$d$1 is established. Accordingly, the interconnect L3 is detected as the critical point. Also, for example, when focusing on the interconnect L4, and comparing an absolute value |II3| of the integrated intensity value II3 of the adjacent interconnect L3 and the second threshold Th2$d$1 of the integrated intensity value, a relationship of |II3|<Th2$d$1 is established. Furthermore, when comparing an absolute value II5 the integrated intensity value II5 of the adjacent interconnect L5 and the second threshold Th2$d$1 of the integrated intensity value, a relationship of |II5|<Th2$d$1 is established. Accordingly, the interconnect L4 is not detected as the critical point. Furthermore, when focusing on the interconnect L5, and comparing an absolute value |II4| of the integrated intensity value II4 of the adjacent interconnect L4 and the second threshold Th2$d$1 of the integrated intensity value, a relationship of |II4|<Th2$d$1 is established. Accordingly, the interconnect L5 is also not detected as the critical point.

It should be noted that the magnitude of a sum, a reduction, a multiplication, or a division between the integrated intensity value of the selected pattern and the integrated intensity value of the adjacent pattern may be set as the second feature amount, and compared to the appropriately set second threshold.

Furthermore, the integrated intensity value may be a value obtained by standardizing an area of the optical image intensity distribution by the CD value.

1.4 Specific Example of Critical Point Display

Figure 8:
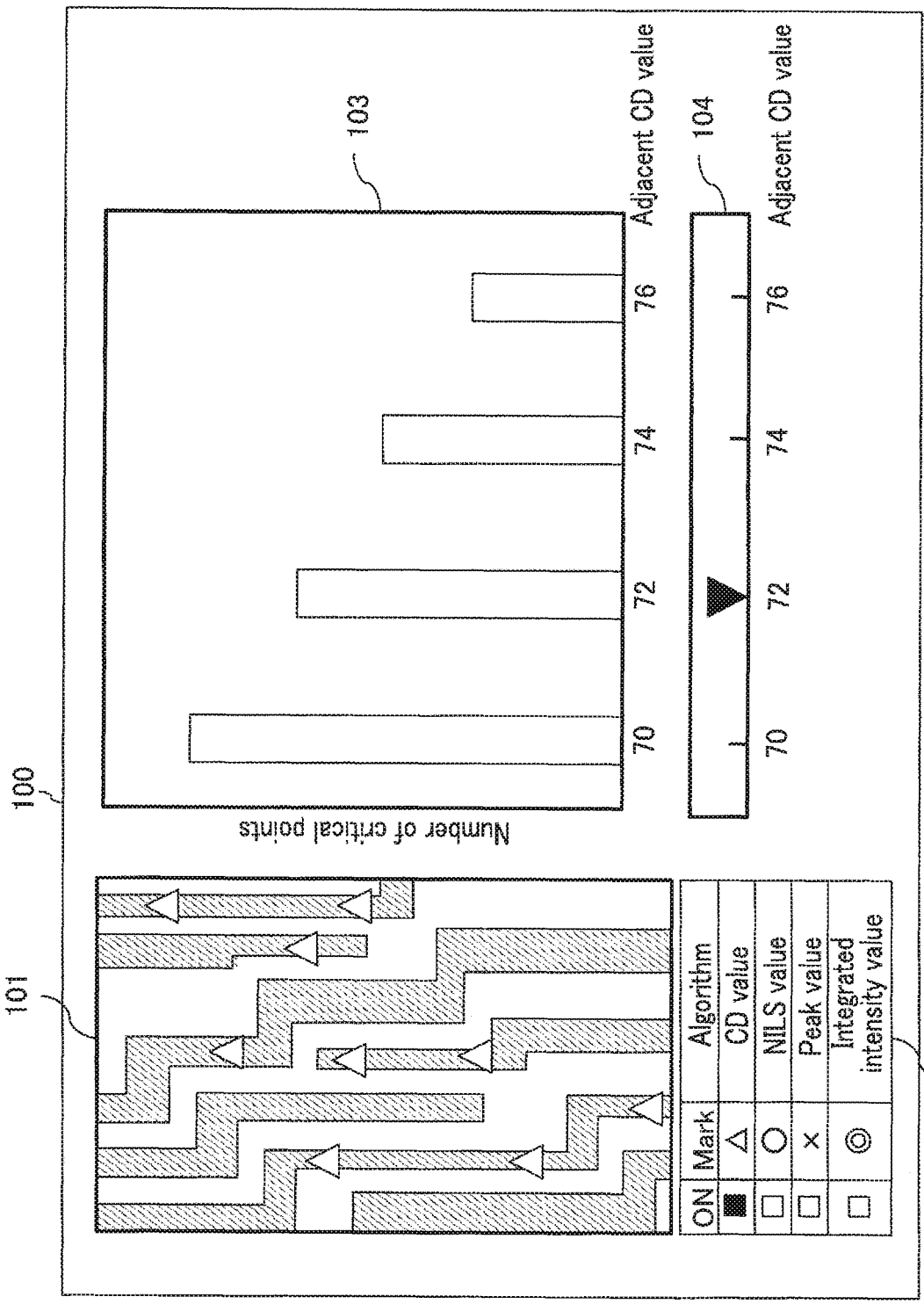
FIG. 8 is a display screen of a mask pattern verification result in a display unit that is included in a mask pattern verification device used for the mask pattern verification method according to the first embodiment.
Figure 9:
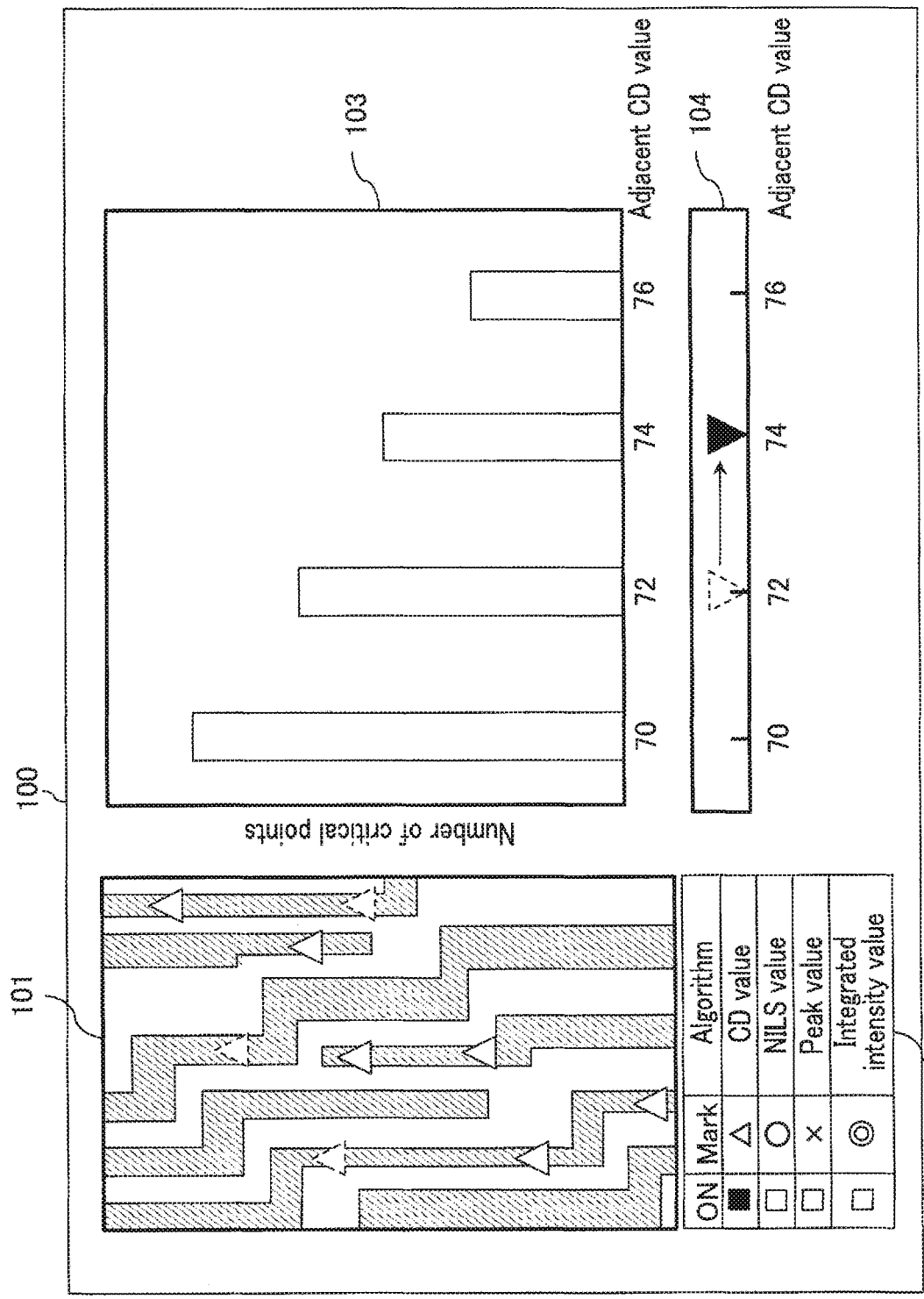
FIG. 9 is a display screen of a mask pattern verification result in a display unit that is included in a mask pattern verification device used for the mask pattern verification method according to the first embodiment.
Figure 10:
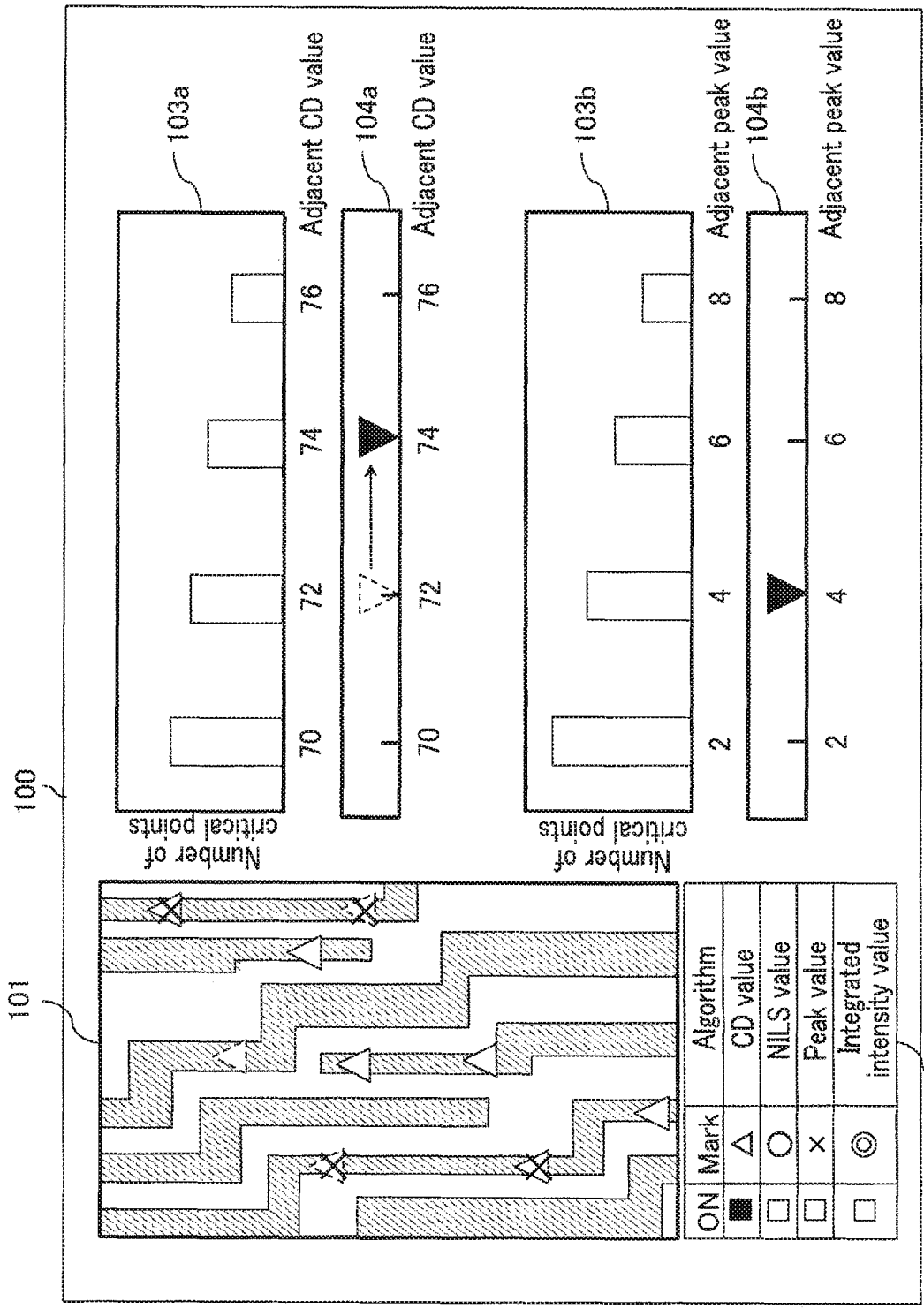
FIG. 10 is a display screen of a mask pattern verification result in a display unit that is included in a mask pattern verification device used for the mask pattern verification method according to the first embodiment.

Now, a specific example of a critical point display in the display unit 20 will be described using FIGS. 8 to 10. FIG. 8 to FIG. 10 respectively show a display screen of the display unit 20. The examples of FIG. 8 and FIG. 9 show a case in which an algorithm corresponding to the CD value is selected, and the example of FIG. 10 shows a case in which algorithms corresponding to the CD value and the peak value are selected. The mask pattern verification device 1 includes, for example, a graphical user interface (GUI), and the user sets display conditions by operating a mouse or a keyboard, etc.

As shown in FIG. 8, a display screen 100 displays, for example, a resist image display window 101, an algorithm selection table 102, a critical point number display window 103, and a second threshold setting display window 104.

The resist image display window 101 displays, for example, an upper surface view of the resist image in a calculation region, and critical points in the selected algorithm. It should be noted that, other than the resist image, circuit pattern data, mask pattern data, or an optical image may also be displayed.

The algorithm selection table 102 is a table for selecting the CD value, the NILS value, the peak value, and the integrated intensity value. In the case of making a selection, for example, a left column of the table (column "ON") is clicked by a mouse, etc. In the example of FIG. 8, the CD value is selected, and the critical points (symbol Δ) corresponding to the CD value are displayed on the resist image display window 101. On the right side of the display screen 100, the critical point number display window 103 and the second threshold setting display window 104 regarding the selected CD value are displayed.

The critical point number display window 103 is a distribution chart of the number of critical points corresponding to the absolute value of the first feature amount of an adjacent pattern. In the example of FIG. 8, the distribution of the number of critical points corresponding too an adjacent CD value, that is, an absolute value of a CD value of an adjacent pattern, is shown.

The second threshold setting display window 104 is a window that sets a second threshold corresponding to the selected algorithm. In the example of FIG. 8, "72" is set as the adjacent CD value, that is, the second threshold Th2$a$1 of the CD value, and critical points corresponding thereto are displayed on the resist image display window 101.

Accordingly, in the display unit 20, when the user selects an algorithm and a second threshold corresponding thereto, the selected algorithm and the critical points corresponding to the second threshold are displayed.

As shown in FIG. 9, the user is able to change the second threshold by shifting a second threshold setting mark (black colored symbol ∇ in FIG. 9) in the second threshold setting display window 104 by a mouse, etc. In the example of FIG. 9, in the second threshold setting display window 104, the adjacent CD value, that is, the second threshold Th2$a$1 of the CD value, is changed from "72" to "74", and the critical points displayed in the resist image display window 101 decrease.

As shown in FIG. 10, a number of algorithms may be selected. In the example of FIG. 10, the algorithm corresponding to the CD value and the algorithm corresponding to the peak value are selected. In this case, the resist image display window 101 displays the critical points (symbol Δ) corresponding to the CD value and the critical points (symbol X) corresponding to the peak value. On the right side of the display screen 100, the critical point number display window 103$a$ and a second threshold setting display window 104$a$ regarding the CD value, and the critical point number display window 103$b$ and a second threshold setting display window 104$b$ regarding the peak value are displayed. The critical point number display window 103$a$ and the second threshold setting display window 104$a$ corresponding the CD value are as mentioned above. In the second threshold setting display window 104$a$, the second threshold Th2$a$1 of the CD value is changed from "72" to "74", and the critical points (symbol Δ) displayed in the resist image display window 101 decrease.

The critical point number display window 103$b$ is a distribution chart of the number of critical points corresponding to an absolute value of an adjacent peak value, that is, the peak value of the adjacent pattern. The second threshold setting display window 104$b$ is a window for setting a second threshold regarding the peak value. In the example of FIG. 10, in the second threshold setting display window 104$b$, "4" is selected as the adjacent peek value, that is, the second threshold Th2$c$1.

It should be noted that the critical point number display window 103 is not limited to a distribution chart of the number of critical points corresponding to the absolute value of the first feature amount of the adjacent pattern. For example, it may be a distribution chart of the number of critical points corresponding to the first feature amount of a selected pattern. In this case, a first threshold setting display window may be displayed instead of the second threshold setting display window 104.

1.5 Advantageous Effects of Present Embodiment

The configuration according to the present embodiment can improve reliability of the mask pattern verification. This effect will be described in detail below.

In the verification of a mask pattern, in many cases, critical points are detected in the case where a feature amount of a selected pattern does not satisfy a certain threshold. In this case, since the critical points are detected only by the feature amount of the selected pattern, detection accuracy of the critical points tend to be low due to the influence of the adjacent pattern. Furthermore, in the case of detecting critical points only by the feature amount of the selected pattern, in order to improve the detection accuracy of the critical points, a resist model for calculating an optical image and a resist image becomes complicated, which tends to cause longer processing time.

In contrast, in the configuration according to the present embodiment, the feature amount of the selected pattern is determined by the first threshold, and such feature amount is further determined by the second threshold using the feature amount of the adjacent pattern of the selected pattern determined as the critical point candidate. Therefore, by considering the influence of the adjacent pattern, the selected pattern that is likely to become the critical point can be detected with high accuracy. Accordingly, the reliability of the mask pattern verification can be improved.

Furthermore, according to the configuration of the present embodiment, since critical points are detected by also considering the feature amount of the adjacent pattern, for example, a simple resist model such as an acid diffusion model, can be applied. Therefore, the increase in the calculation time of the optical image and the resist image can be suppressed, and the increase in the processing time of the mask pattern verification can be suppressed.

Furthermore, according to the configuration of the present embodiment, critical points can be detected by a plurality of detection methods that adopt algorithms corresponding to the CD value, the NILS value, the peak value, and the integrated intensity value. Accordingly, by adopting a plurality of algorithms, the selected patterns that are likely to become critical points can be detected with higher accuracy.

Furthermore, according to the configuration of the present embodiment, the critical points detected by the selected plurality of algorithms can be displayed on one display screen. The selected algorithms can also be changed on the display screen. This allows the user to confirm the critical points more easily, thereby improving the operability of the mask pattern verification device.

Furthermore, according to the configuration of the present embodiment, the second threshold corresponding to the selected algorithms can be changed on the display screen. This allows the user to confirm the critical points more easily, thereby improving the operability of the mask pattern verification device.

2. Second Embodiment

The second embodiment will now be described. In the second embodiment, a case in which a subtraction between a first feature amount of a selected pattern and a first feature amount of an adjacent pattern, that is, a magnitude of difference is defined as a second feature amount will be described. In the following, only matters different from the first embodiment will be described.

2.1 Algorithm Corresponding to CD Value

Figure 11:
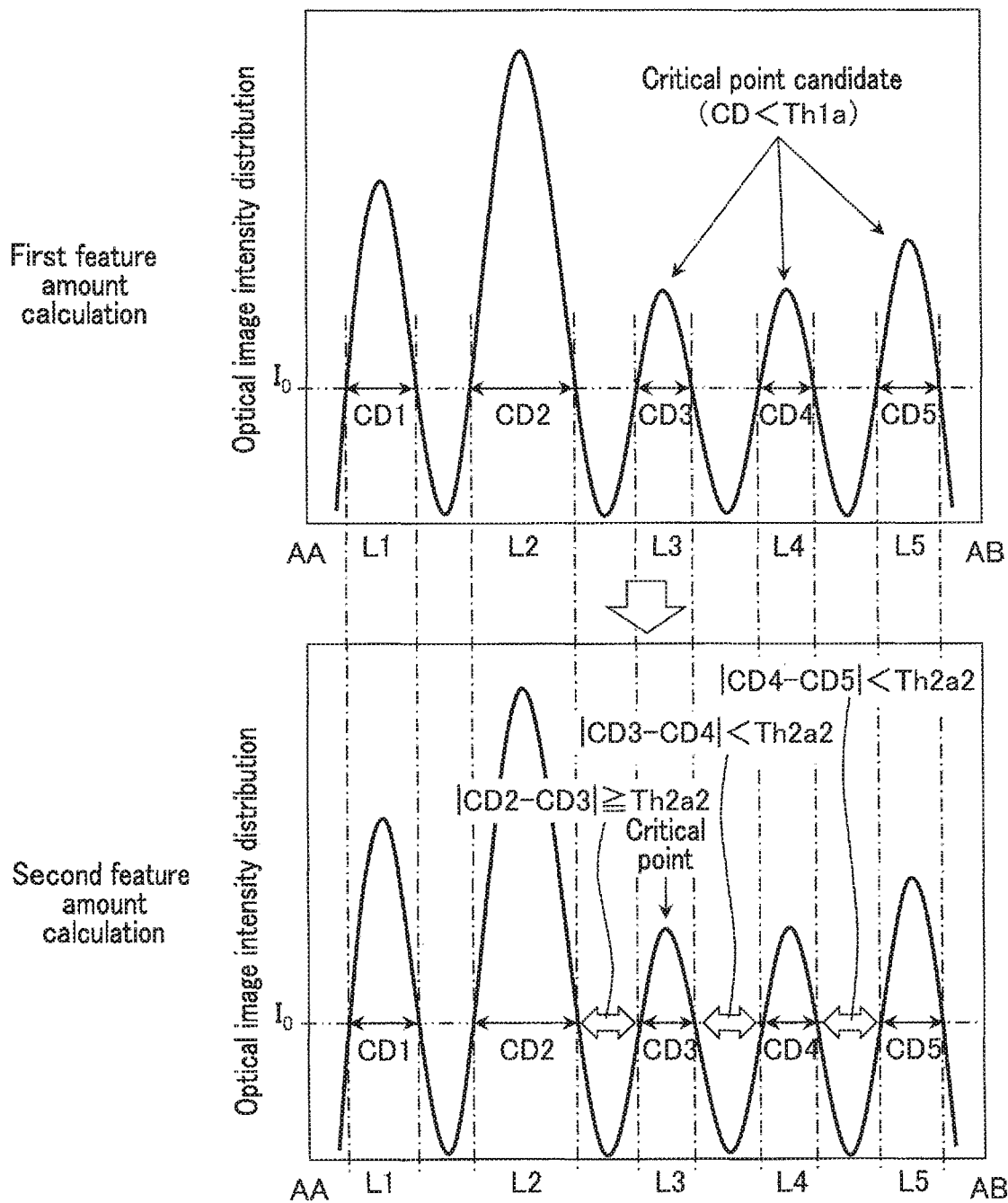
FIG. 11 is a diagram showing first and second feature amounts based on a CD value in a mask pattern verification method according to a second embodiment.

First, an algorithm corresponding to a CD value will be described using FIG. 11. FIG. 11 shows an optical image intensity distribution on a wafer taken along line AA-AB. An upper graph in FIG. 11 shows the first feature amount based on the CD value, and a lower graph in FIG. 11 shows the second feature amount calculated by using the first feature amount.

As shown in the upper graph of FIG. 11, the calculation of the first feature amount in the CD value is the same as that in. FIG. 4 of the first embodiment.

As shown in the lower graph of FIG. 11, the second feature amount is obtained for CD values CD3, CD4, and CD5. More specifically, a difference between the CD value of an interconnect regarded as a critical point candidate and a CD value of an adjacent interconnect is obtained, and in the case where the magnitude of such difference is equal to or greater than a second threshold Th$2a2$ of the CD value, such corresponding interconnect, that is, the selected pattern, is detected as a critical point. For example, when focusing on an interconnect L3, and comparing the magnitude of difference CD2−CD3 between the CD value CD3 of the interconnect L3 and a CD value. CD2 of an interconnect L2 that is adjacent to one side of the interconnect L3, with the second threshold Th$2a2$ of the CD value, a relationship of |CD2−CD3|≥Th$2a2$ is established. Accordingly, the interconnect L3 is detected as the critical point. Also, for example, when focusing on an interconnect L4, and comparing the magnitude of difference |CD3−CD4| between the CD value CD4 of the interconnect L4 and the CD value CD3 of the interconnect L3, with the second threshold Th$2a2$ of the CD value, a relationship of |CD3−CD4|<Th$2a2$ is established. Furthermore, when comparing the magnitude of difference |CD4−CD5 between the CD value CD4 of the interconnect L4 and the CD value CD5 of an interconnect L5, with the second threshold Th$2a2$ of the CD value, a relationship of |CD4−CD5|<Th$2a2$ is established. Accordingly, the interconnect L4 is not detected as the critical point. In the same manner, based on a relationship of |CD4−CD5|< (Th$2a2$, the interconnect L5 is also not detected as the critical point.

2.2 Algorithm Corresponding to NILS Value

Figure 12:
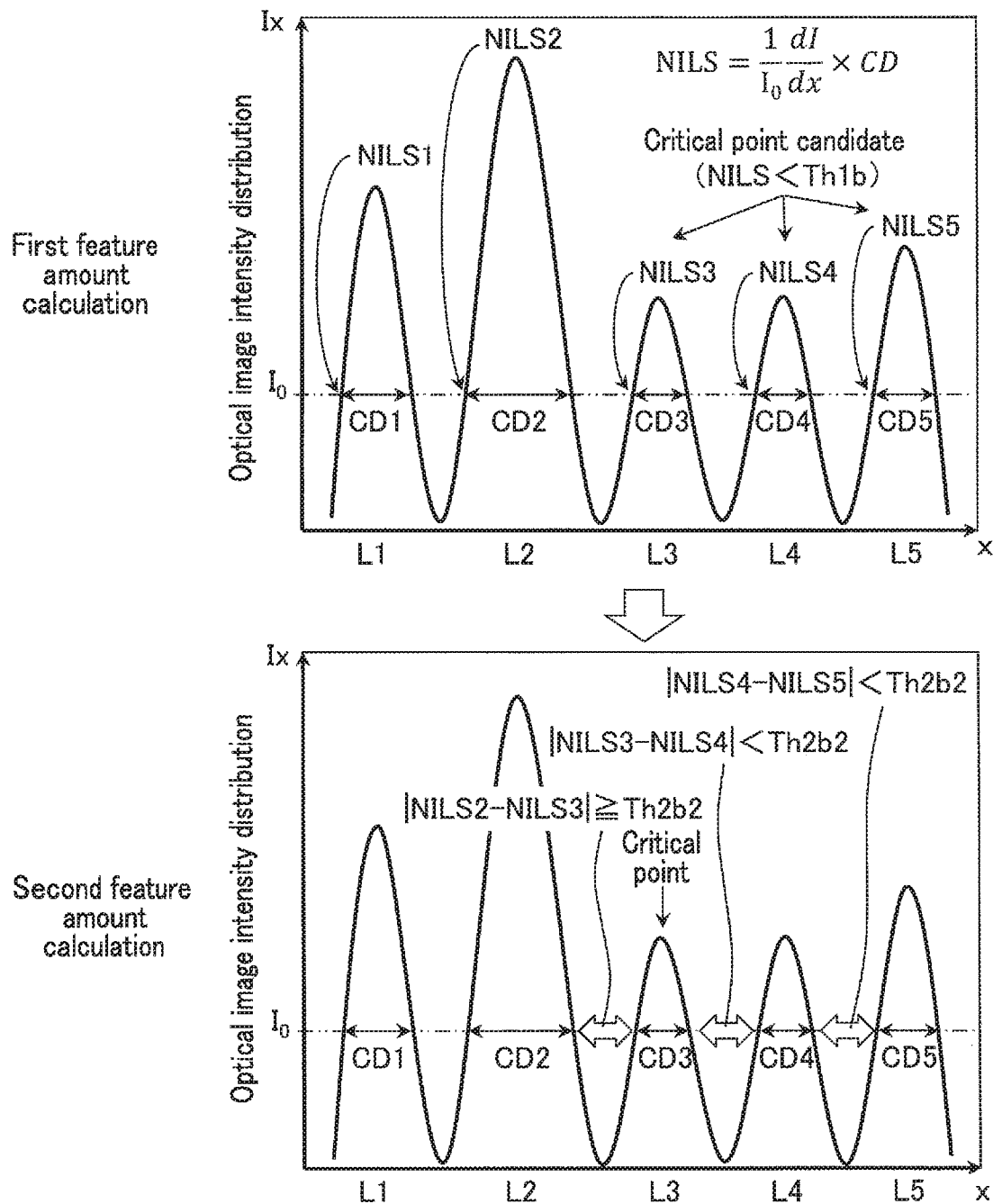
FIG. 12 is a diagram showing first and second feature amounts based on a NILS value in the mask pattern verification method according to the second embodiment.

Now, an algorithm corresponding to a NILS value will be described using FIG. 12. FIG. 12 shows an optical image intensity distribution on a wafer taken along line AA-AB. An upper graph in FIG. 12 shows a first feature amount based on the NILS value, and a lower graph in FIG. 12 shows a second feature amount calculated by using the first feature-amount.

As shown in the upper graph of FIG. 12, the calculation of the first feature amount in the NILS value is the same as that in FIG. 5 of the first embodiment.

As shown in the lower graph of FIG. 5, the second feature amount is obtained for NILS values NILS3, NILS4, and NILS5. More specifically, a difference between the NILS value of an interconnect regarded as a critical point candidate and a NILS value of an adjacent interconnect is obtained, and in the case where the magnitude of the difference thereof is equal to or greater than a second threshold Th$2b2$ of the NILS value, such corresponding interconnect, that is, the selected pattern, is detected as the critical point. Also, for example, when focusing on an interconnect L3, and comparing the magnitude of difference |NILS2−NILS3| between the NILS value NILS3 of the interconnect L3 and a NILS value NILS2 of an interconnect 12, with the second threshold Th$2b2$ of the NILS, value, a relationship of |NILS2−NILS3|≥Th$2b2$ is established. Accordingly, the interconnect L3 is detected as the critical point. Furthermore, for example, when focusing on an interconnect L4, and comparing the magnitude of difference |NILS3<NILS4| between the NILS value NILS4 of the interconnect L4 and the NILS value NILS3 of the interconnect L3, with the second threshold Th$2b2$ of the NILS value, a relationship of |NILS3−NILS4|<Th$2b2$ is established. Furthermore, when comparing the magnitude of difference |NILS4−NILS5| between the NILS value NILS4 of the interconnect L4 and the NILS value NILS5 of an interconnect L5, with the second threshold Th$2b2$ of the NILS value, a relationship of |NILS4−NILS5|<Th$2b2$ is established.

Accordingly, the interconnect L4 is not detected as the critical point. In the same manner, based on a relationship of |NILS4−NILS5|≤Th2$b$2, the interconnect L5 is also not detected as the critical point.

2.3 Algorithm Corresponding to Peak Value

Figure 13:
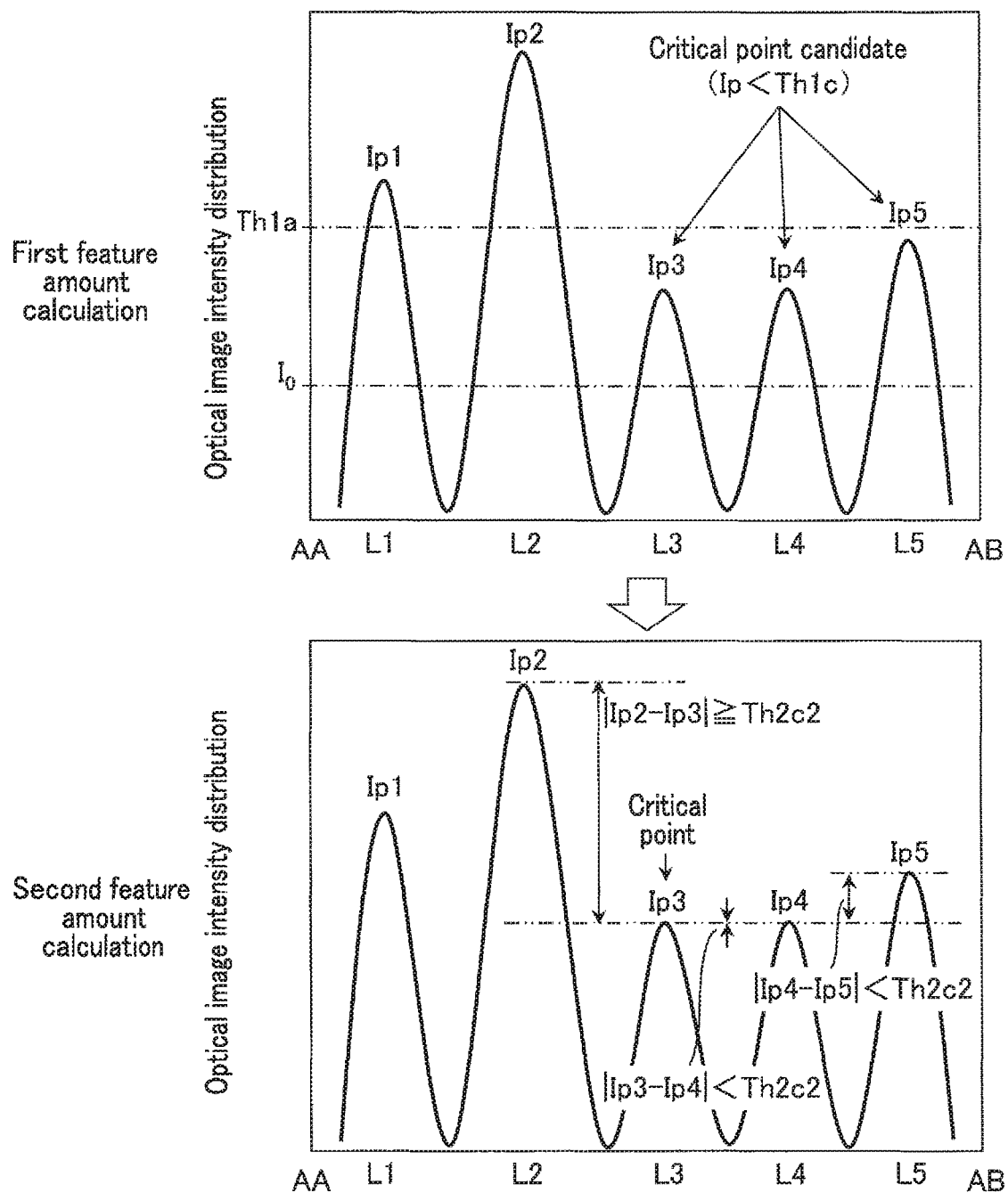
FIG. 13 is a diagram showing first and second feature amounts based on a peak value in the mask pattern verification method according to the second embodiment.

Now, an algorithm corresponding to a peak value will be described using FIG. 13. FIG. 13 shows an optical image intensity distribution on a wafer taken along line AA-AB. An upper graph in FIG. 13 shows a first feature amount based on the peak value, and a lower graph in FIG. 13 shows a second feature amount calculated by using the first feature amount.

As shown in the upper graph of FIG. 13, the calculation of the first feature amount in the peak value is the same as that in FIG. 6 of the first embodiment.

As shown in the lower graph of FIG. 13, the second feature amount is obtained for peak values Ip3, Ip4, and Ip5. More specifically, a difference between the peak value of an interconnect regarded as a critical point candidate and a peak value of an adjacent interconnect is obtained, and in the case where the magnitude of the difference thereof is equal to or greater than a second threshold Th2$c$2 of the peak value, such corresponding interconnect, that is, the selected pattern, is detected as a critical point. For example, when focusing on an interconnect L3, and comparing the magnitude of difference Ip2−Ip3 between the peak value Ip3 of the interconnect L3 and a peak value Ip2 of an interconnect L2 that is adjacent to one side of the interconnect L3, with a second threshold Th2$c$2 of the peak value, a relationship of |Ip2−Ip3|≥Th2$c$2 is established. In this case, regardless of the magnitude of difference between the peak value Ip3 of the interconnect L3 and the peak value Ip4 of an interconnect L4 that is adjacent to the other side of the interconnect L3, the interconnect L3 is detected as the critical point. Also, for example, when focusing on the interconnect L4, and comparing the magnitude of difference |Ip3−Ip4| between the peak value Ip4 of the interconnect L4 and the peak value Ip3 of the interconnect L3, with the second threshold Th2$c$2 of the peak value, a relationship of |Ip3−Ip4|<Th2$c$2 is established. Furthermore, when comparing the magnitude of difference |Ip4−Ip5| between the peak value Ip4 of the interconnect L4 and the peak value Ip5 of an interconnect L5, with the second threshold Th2$c$2 of the peak value, a relationship of |Ip4−Ip5|<Th2$c$2 is established. Accordingly, the interconnect L4 is not detected as the critical point. In the same manner, based on a relationship of |Ip4−Ip5|<Th2$c$2, the interconnect L5 is also not detected as the critical point.

2.4 Algorithm Corresponding to Integrated Intensity Value

Figure 14:
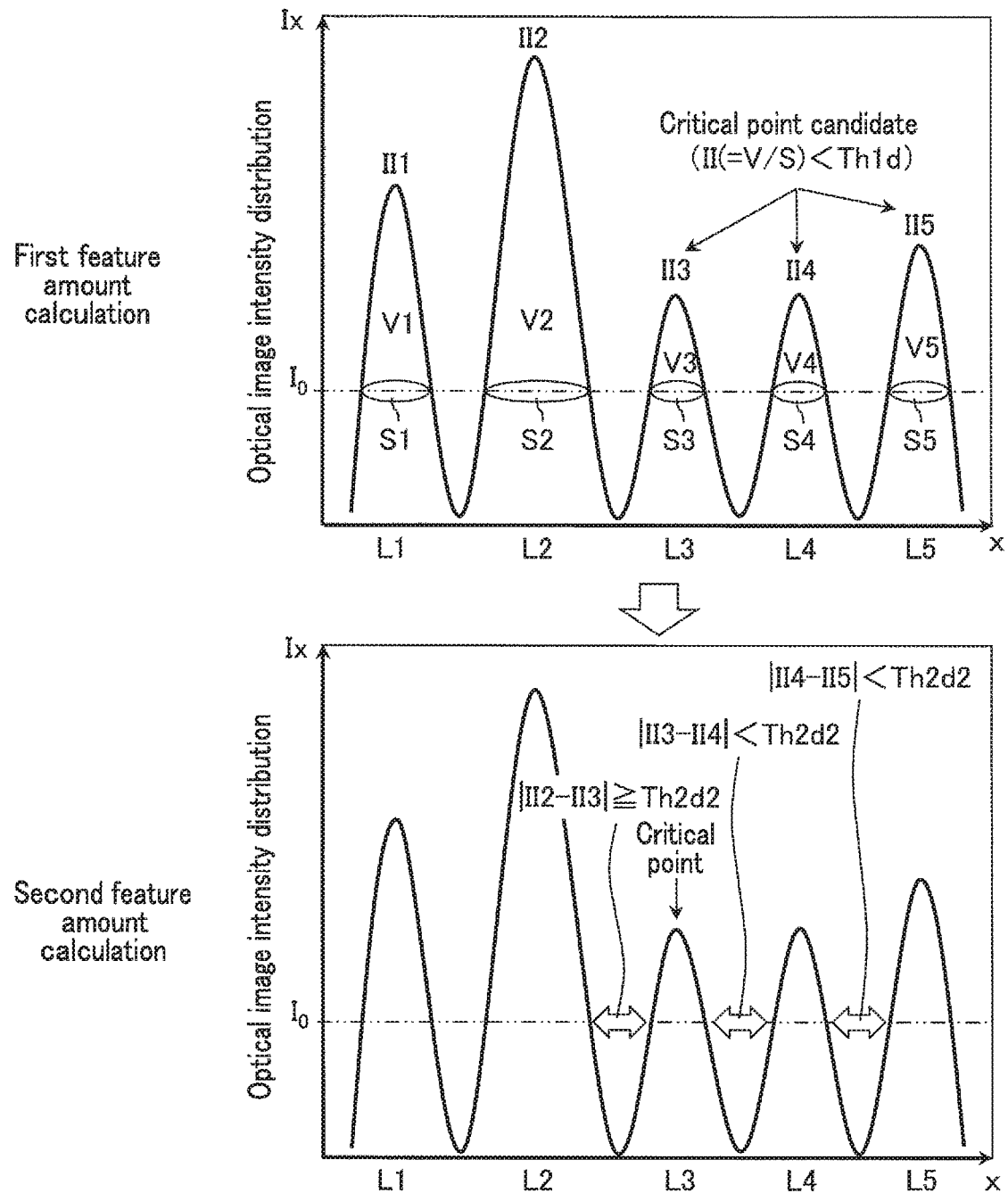
FIG. 14 is a diagram snowing first and second feature amounts based on an integrated intensity value in the mask pattern verification, method according to the second embodiment.

Now, an algorithm corresponding to an integrated intensity value will be described using FIG. 14. FIG. 14 shows an optical image intensity distribution on a wafer taken along line AA-AB. An upper graph in FIG. 14 shows a first feature amount based on the integrated intensity value, and a lower graph in FIG. 14 shows a second feature amount calculated by using the first feature amount.

As shown in the upper graph of FIG. 14, the calculation of the first feature amount in the integrated intensity value is the same as that in FIG. 7 of the first embodiment.

As shown in the lower graph of FIG. 14, the second feature amount is obtained for integrated intensity values II3, II4, and II5. More specifically, a difference between the integrated intensity value of an interconnect regarded as a critical point candidate and an integrated intensity value of an adjacent interconnect is obtained, and in the case where the magnitude of the difference thereof is equal to or greater than a second threshold Th2$d$2 of the integrated intensity value, such corresponding interconnect, that is, the selected pattern, is detected as a critical point. For example, when focusing on the interconnect L3, and comparing the magnitude of difference |II2−II3| between the integrated intensity value II3 of the interconnect L3 and an integrated intensity value II2 of the interconnect L2, with the second threshold Th2$d$2 of the integrated intensity value, a relationship of |II2−II3|≥Th2$d$2 is established. Accordingly, the interconnect L3 is detected as the critical point. Also, for example, when focusing on the interconnect L4, and comparing the magnitude of difference |II3−II4| between the integrated intensity value II4 of the interconnect L4 and the integrated intensity value II3 of the interconnect L3, with the second threshold Th2$d$2 of the integrated intensity value, a relationship of |II3−II4|<Th2$d$2 is established. Furthermore, when comparing the magnitude of difference |II4−II5| between the integrated intensity value II4 of the interconnect L4 and the integrated intensity value II5 of the interconnect L5, with the second threshold Th2$d$2 of the integrated intensity value, a relationship of |II4−II5|<Th2$d$2 is established. Accordingly, the interconnect L4 is not detected as the critical point. In the same manner, based on a relationship of |II4−II5|<Th2$d$2, the interconnect L5 is also not detected as the critical point.

2.5 Advantageous Effects of Present Embodiment

The configuration of the present embodiment achieves advantageous effects similar to those achieved by the first embodiment.

3. Third Embodiment

The third embodiment will now be described. In the third embodiment, a case in which a mask pattern is verified using, instead of a second feature amount, a third feature amount that takes into account a selected pattern and an adjacent pattern, will be described. In the following, only matters different from the first embodiment will be described.

3.1 Mask Pattern Verification Method

A mask pattern verification method will be described using FIG. 15.

Figure 15:
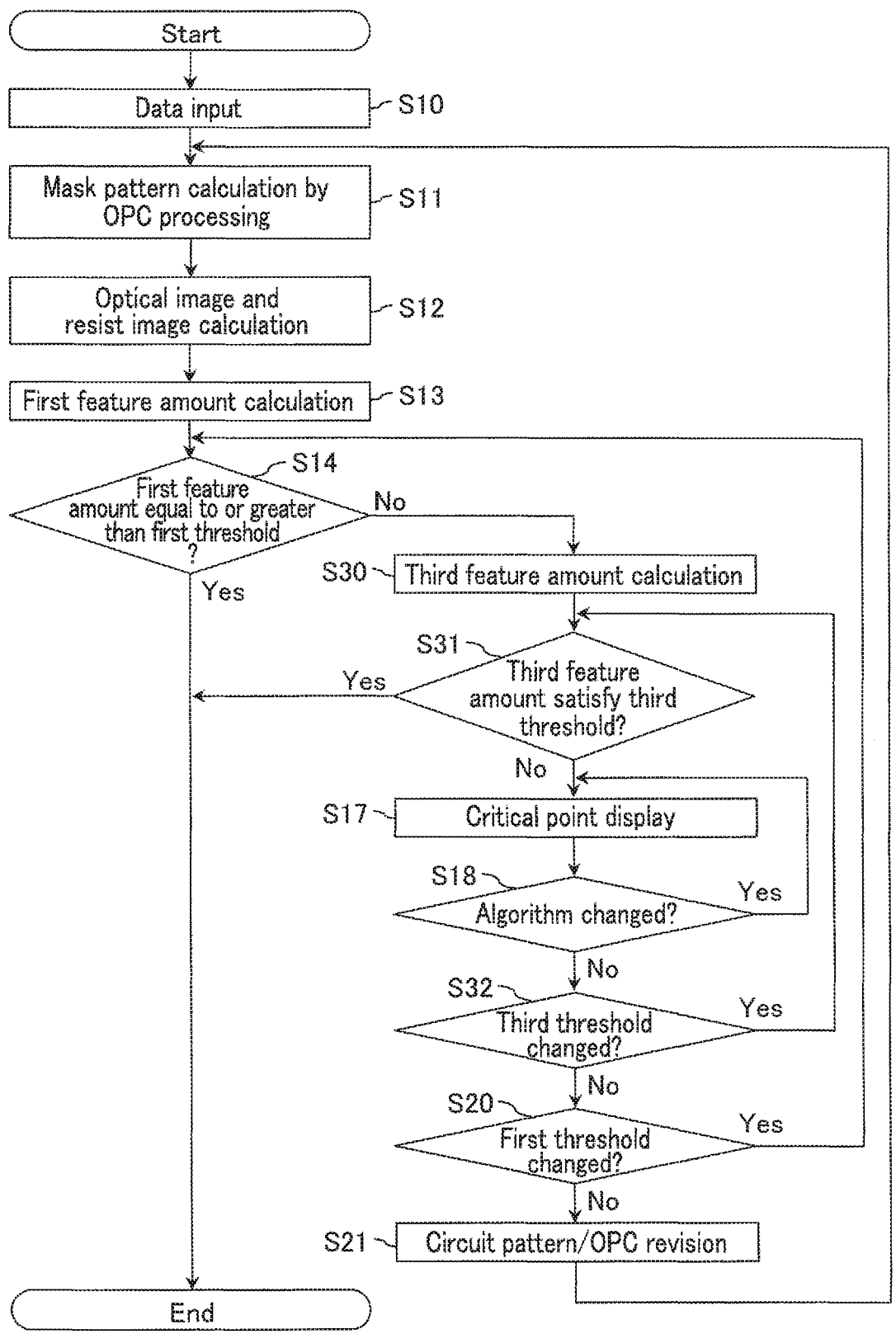
FIG. 15 is a flowchart of a verification operation in a mask pattern verification method according to a third embodiment.

As shown in FIG. 15, the processing from step S10 to step S14 is the same as that of FIG. 2 of the first embodiment.

In the case where a first feature amount is smaller than a first threshold (step S14_No), a feature amount calculation circuit 54 detects such corresponding portion as a critical point candidate. The feature amount calculation circuit 54 calculates the third feature amount with respect to the detected critical point candidate (step S30). The feature amount calculation circuit 54 in the present embodiment calculates the third feature amount based on a layout of the selected pattern and the adjacent pattern. The third feature amount is a feature amount attributable to a shape of a circuit pattern, and is set to, for example, one of a distance between a selected pattern and an adjacent pattern, a width of the adjacent pattern, and a coverage rate of the adjacent pattern with respect to the selected pattern. The coverage rate indicates a ratio of a length in which the adjacent pattern is arranged in parallel with respect to a length of the interconnect of the selected pattern.

A critical point detector 55 then compares the third feature amount and a third threshold, and detects the critical point (step S31). The third threshold is a threshold for determining the third feature amount, and is set as appropriate by a user.

In the case where the third feature amount satisfies the third threshold. (step S31_Yes), the critical point detector 55 determines that there are no critical points in a calculation region. More specifically, in the case where, for example, the third feature amount is a distance between the selected pattern and the adjacent pattern, the critical point detector 55 determines that the third feature amount satisfies the third threshold if the third feature amount is equal to or smaller than the third threshold. Furthermore, for example, in the case where the third feature amount is a width of the adjacent pattern, the critical point detector 55 determines that the third feature amount satisfies the third threshold if the third feature amount is equal to or smaller than the third threshold. A controller 50 displays a detection result on a display unit 20, and ends the verification of the mask pattern in the selected calculation region. It should be noted that the controller 50 may also display on the display unit 20 the resist image of the calculation region and the critical point candidate corresponding to the first feature amount that is smaller than the first threshold.

In the case where the third feature amount does not satisfy the third threshold (step S31_No), the critical point detector 55 detects such corresponding selected pattern as the critical point.

The processing of steps S17 and S18 is the same as that in FIG. 2 of the first embodiment.

The user may confirm the display of the display unit and change the third threshold (step S32). In the case where the third threshold is changed by the user (step S32 Yes), the controller 50 returns to step S31, and the determination of the third feature amount and the detection of the critical point are performed again based on the changed third threshold. In the case where the third threshold is not changed by the user (steps S32_No), the display state is maintained based on the selected third threshold.

The processing of steps S20 and S21 is the same as that in FIG. 2 of the first embodiment.

It should be noted that in the example of FIG. 11, a case in which the third feature amount is calculated only for the selected pattern that is detected as the critical point candidate has been described; however, the third feature amount may be calculated for all of the selected patterns. In this case, the first and the third feature amounts are calculated, for example, in step S13, and step S30 is abolished.

3.2 Advantageous Effects of Present Embodiment

The configuration of the present embodiment achieves advantageous effects similar to those of the first and the second embodiments.

Furthermore, according to the configuration of the present embodiment, a critical point can be detected by calculating a third feature amount based on a layout of an adjacent pattern that is adjacent to the selected pattern. If a distance between the selected pattern and the adjacent pattern is different, an influence to the critical point caused by the adjacent pattern is different. For example, in the case where the adjacent pattern is apart from the selected pattern by at least 1 μm, the influence caused by the adjacent pattern may be considered small. Also, even if, for example, the distance between the selected pattern and the adjacent pattern is the same, the influence of the adjacent pattern is different depending on an interconnect width or a coverage rate of the adjacent pattern. Accordingly, by taking into account the influence of the layout of the adjacent pattern, critical points can be detected with high accuracy.

4. Fourth Embodiment

The fourth embodiment will now be described. In the fourth embodiment, a case in which the determination of the first feature amount and the determination of the third feature amount in the third embodiment are performed collectively will be described. In the following, only matters different from the first to the third embodiments will be described.

4.1 Mask Pattern Verification Method

A mask pattern verification method will be described using FIG. 16.

Figure 16:
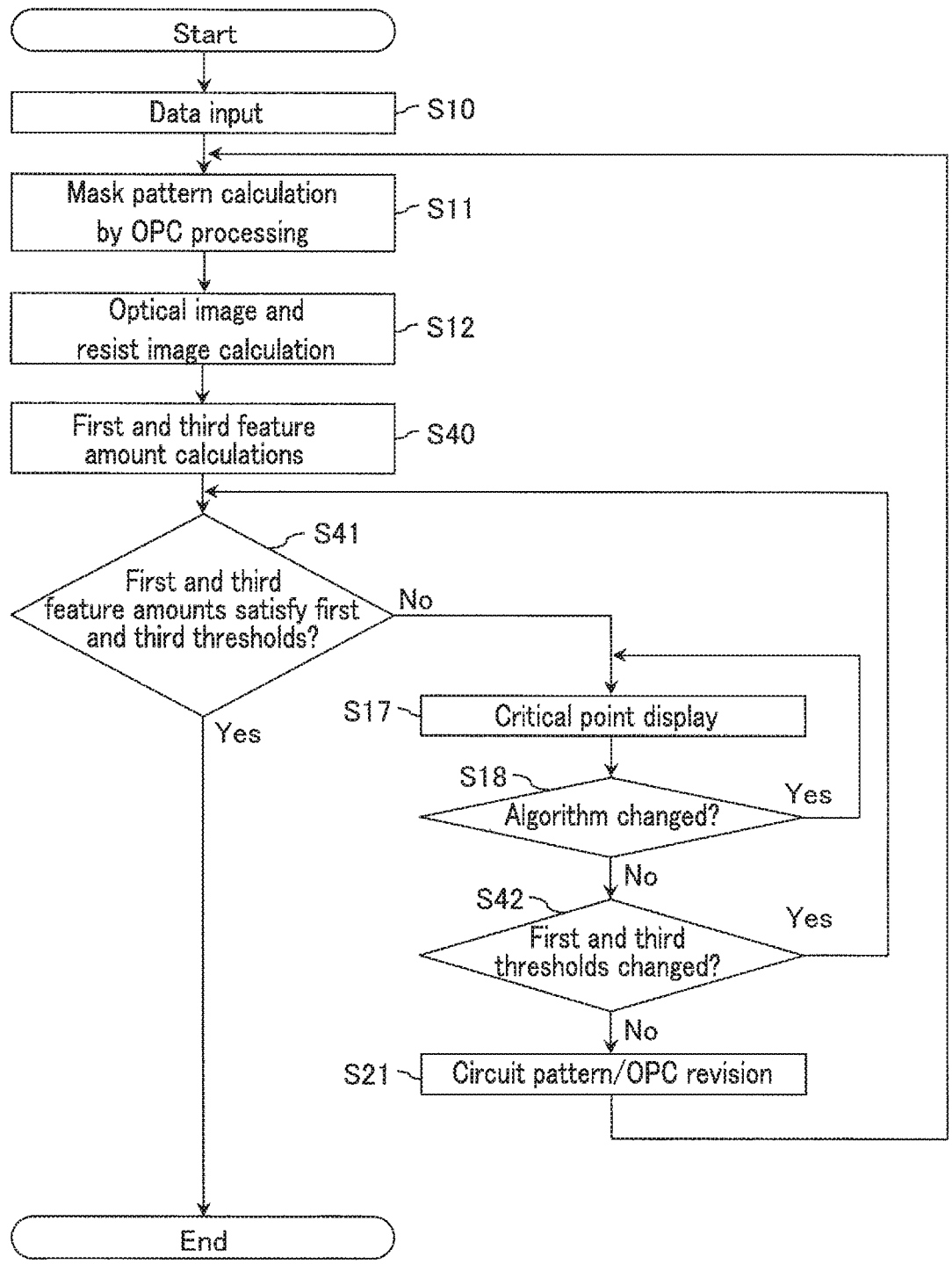
FIG. 16 is a flowchart of a verification operation in a mask pattern verification method according to a fourth embodiment.

As shown in FIG. 16, the processing from step S10 to step S12 is the same as that of FIG. 2 of the first embodiment.

A feature amount calculation circuit 54 calculates the first and the third feature amounts with respect to all of the selected patterns in a verification region (step S40).

A critical point detector 55 then compares the first feature amount with a first threshold, and the third feature amount with a third threshold to detect critical points (step S41). More specifically, the critical point detector 55 detects a point at which the first feature amount is smaller than the first threshold, and the third feature amount does not satisfy the third threshold as the critical point.

In the case where the first and the third feature amounts satisfy the first and the third thresholds (step S41_Yes), the critical point detector 55 determines that there are no critical points in a verification region. A controller 50 displays a detection result on a display unit 20, and ends the verification of the mask pattern in a selected verification region.

In the case where the first and the third feature amounts do not satisfy the first and the third thresholds (step S41_No), the feature amount calculation circuit 54 detects such corresponding selected pattern as the critical point.

The processing of steps S17 and S18 is the same as that in FIG. 2 of the first embodiment.

A user may confirm the display of the display unit 20 and change the first and the third thresholds (step S42). In the case where at least one of the first and the third thresholds are changed by the user (step S42_Yes), the controller 50 returns to step S41, and the determination of the first and the third feature amounts and the detection of the critical point are performed again based on the changed first threshold and/or third threshold. In the case where the first and the third thresholds are not changed by the user (step S42_No), the display state is maintained based on the selected first and the third thresholds.

The processing of step S21 is the same as that in FIG. 2 of the first embodiment.

It should be noted that in the present embodiment, a case in which the first and the third feature amounts are collectively determined is described; however, the first and the second feature amounts may also be collectively determined. In this case, in the flowchart of FIG. 16, the third feature amount is replaced by the second feature amount, and the third threshold is replaced by the second threshold.

4.2 Advantageous Effects of Present Embodiment

The configuration of the present embodiment achieves advantageous effects similar to those of the first to the third embodiments.

Furthermore, according to the configuration of the present embodiment, since the first feature amount and the third feature amount are collectively determined, processing speed of the mask pattern verification can be improved.

5. Fifth Embodiment

The fifth embodiment will now be described. In the fifth embodiment, a case in which first to third feature amounts are used to verify a mask pattern will be described. In the following, only matters different from the first to the fourth embodiments will be described.

5.1 Mask Pattern Verification Method

A mask pattern verification method will be described using FIG. 17 and FIG. 18.

Figure 17:
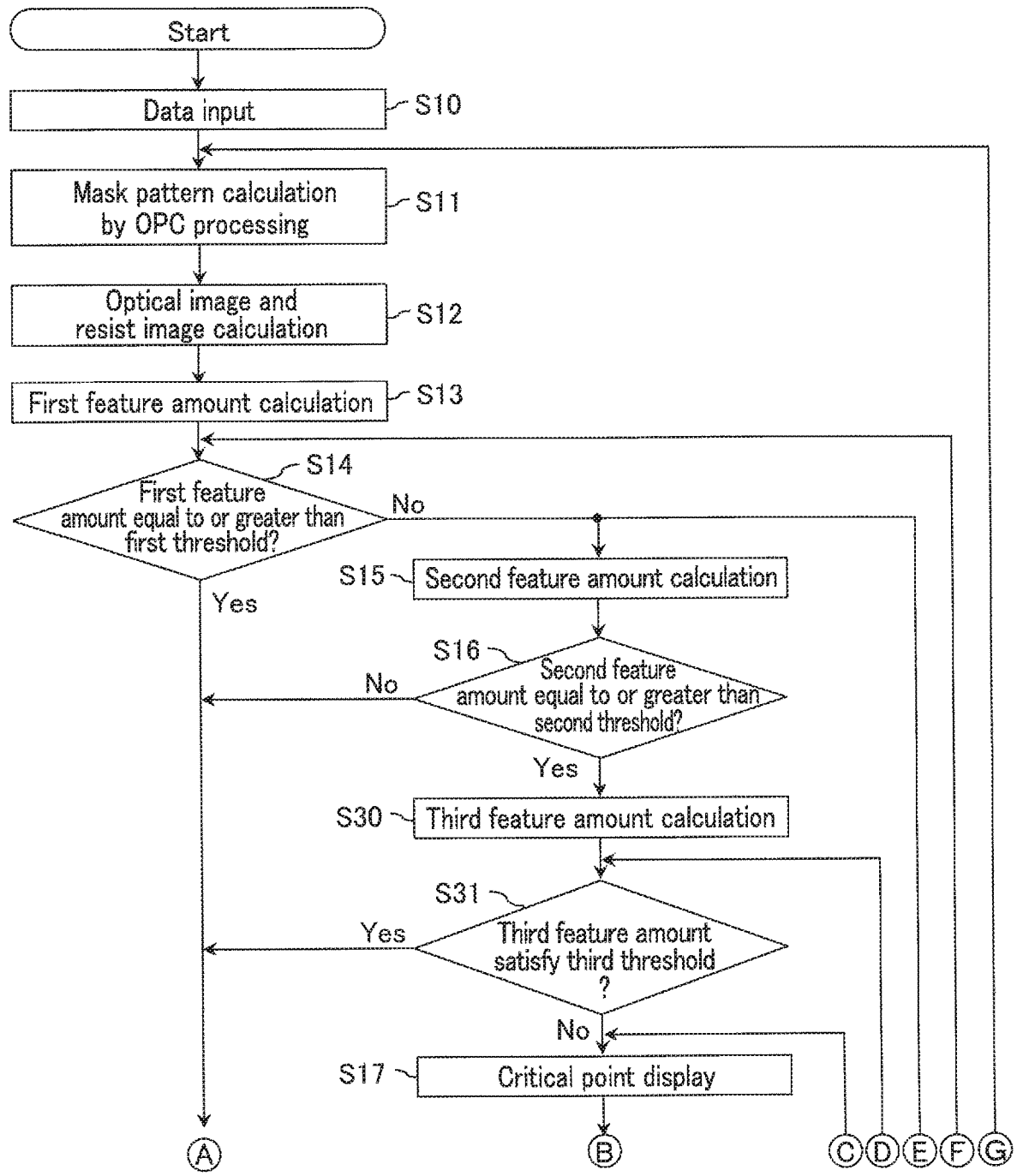
FIG. 17 is a flowchart of a verification operation in a mask pattern verification method according to a fifth embodiment.
Figure 18:
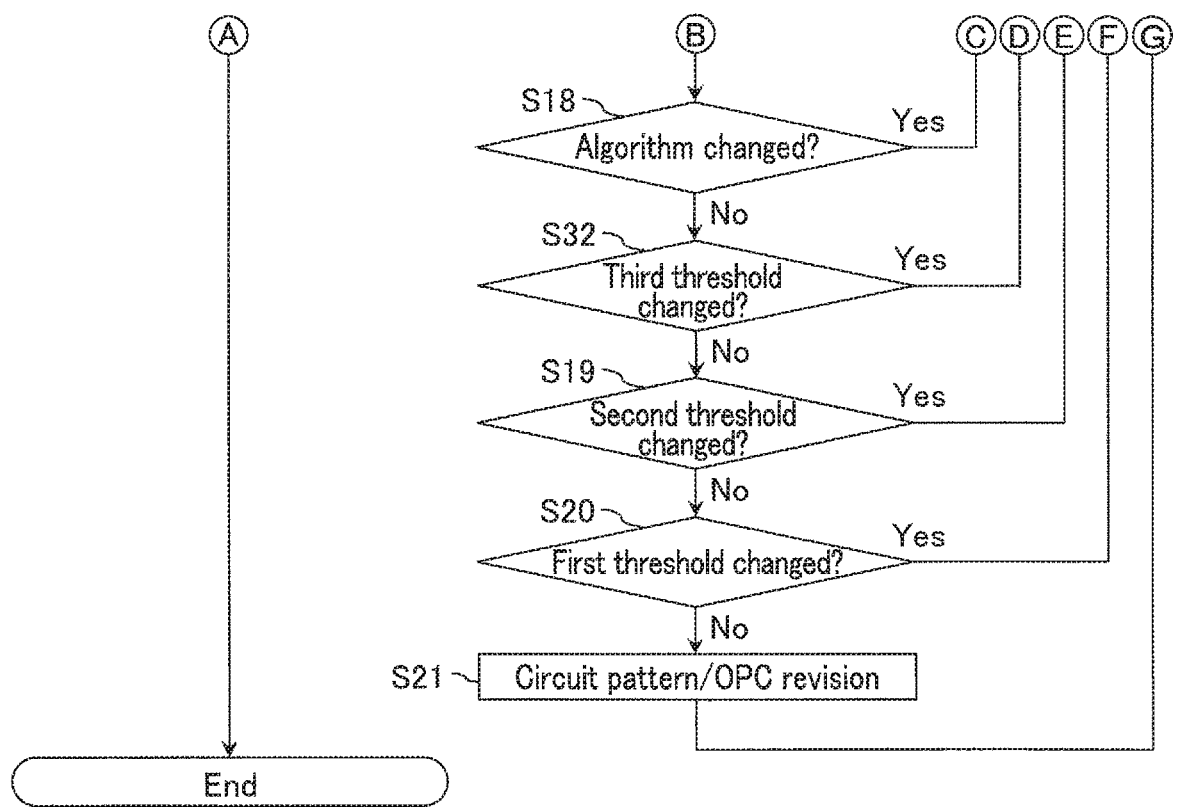
FIG. 18 is a flowchart of a verification operation in a mask pattern verification method according to the fifth embodiment.

As shown, In FIG. 17 and FIG. 18, the processing from step S10 to step S16 is the same as that in FIG. 2 of the first embodiment.

In the case where the second feature amount is equal to or greater than a second threshold (step S16_Yes), a feature amount calculation circuit 54 calculates the third feature amount (step S30).

A critical point detector 55 then compares the third feature amount and a third threshold (step S31).

In the case where the third feature amount satisfied the third threshold (step S31_Yes), the critical point detector 55 determines that there are no critical points in a calculation region. A controller 50 displays a detection result on a display unit 20, and ends the verification of the mask pattern in the selected calculation region. It should be rioted that the controller 50 may also display on the display unit 20 a resist image of the calculation region and a critical point candidate corresponding to the second feature amount that is equal to or greater than the second threshold.

In the case where the third feature amount does not satisfy the third threshold (step S31_No), the critical point detector 55 detects such corresponding selected pattern as the critical point.

The processing of step S17 is the same as that in FIG. 2 of the first embodiment.

The user may change algorithms and one of the first to the third thresholds in each step of steps S18, S32, S19, and S20 in the same manner as in FIG. 2 of the first embodiment and FIG. 11 of the second embodiment.

The processing of step S21 is the same as that in FIG. 2 of the first embodiment.

It should be noted that the first to the third feature amounts may also be calculated with respect to all of the selected patterns. In this case, the first to the third feature amounts are calculated, for example, in step S13, and steps S15 and S30 are abolished.

5.2 Advantageous Effects of Present Embodiment

The configuration of the present embodiment achieves advantageous effects similar to those of the first to the fourth embodiments.

6. Sixth Embodiment

The sixth embodiment will now be described. In the sixth embodiment, a case in which the first to the third feature amounts are collectively determined in the fifth embodiment will be described. In the following, only matters different from the first to the fifth embodiments will be described.

6.1 Mask Pattern Verification Method

A mask pattern verification method will be described using FIG. 19.

Figure 19:
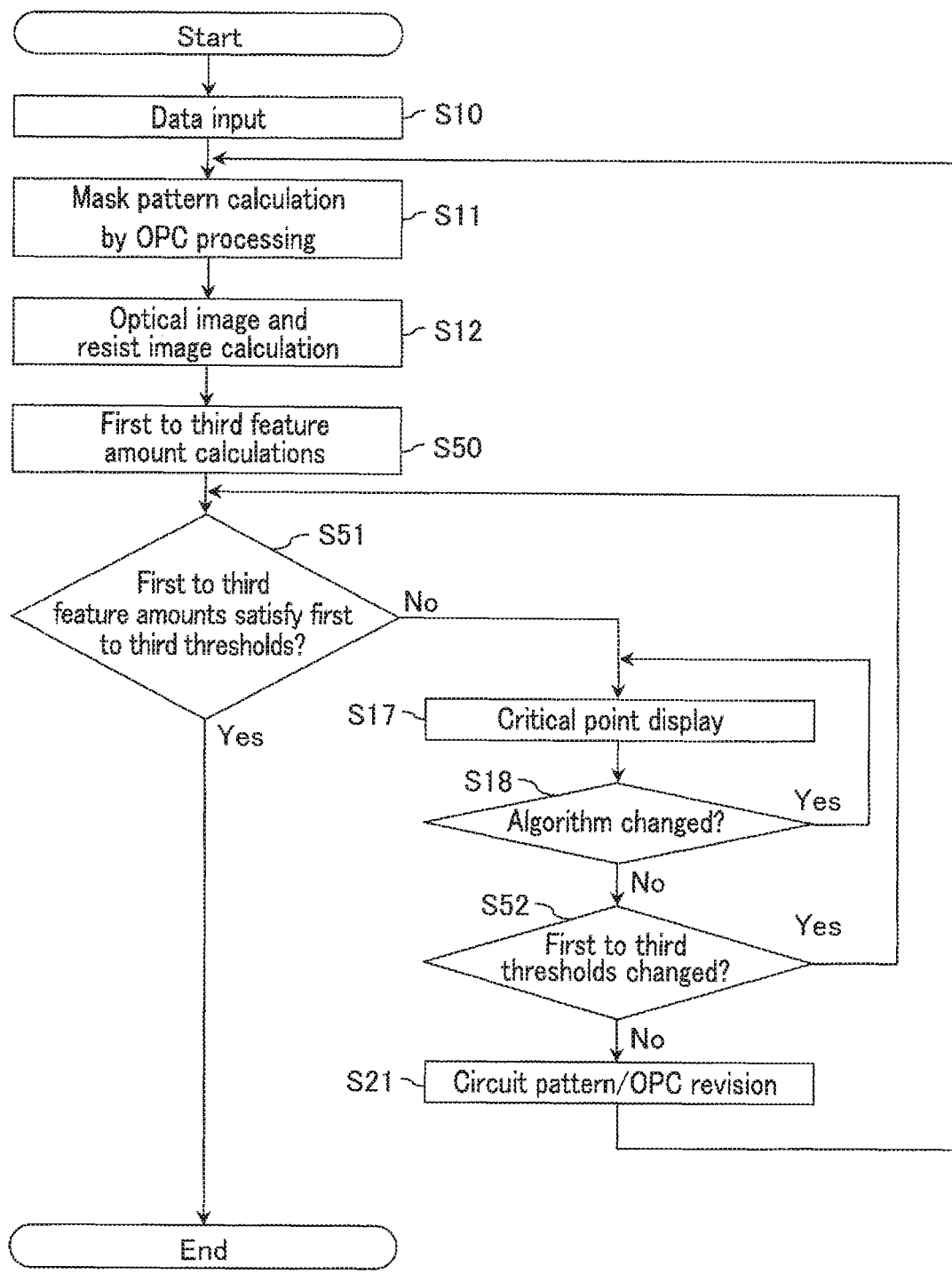
FIG. 19 is a flowchart of a verification operation in a mask pattern verification method according to a sixth embodiment.

As shown, in FIG. 19, the processing from steps S10 to S12 is the same as that in FIG. 2 of the first embodiment.

A feature amount calculation circuit 54 calculates the first to the third feature amounts with respect to all of the selected patterns in a calculation region (step S50).

A critical point detector 55 then compares the first feature amount with a first threshold, the second feature amount with a second threshold, and the third feature amount with a third threshold to detect critical points (step S51). More specifically, the critical point detector 55 detects a spot at which the first feature amount is smaller than the first threshold, the second feature amount is equal to or greater than the second threshold, and the third feature amount does not satisfy the third threshold as the critical point.

In the case where the first to the third feature amounts respectively satisfy the first to the third thresholds (step S51_Yes), the critical point detector 55 determines that there are no critical points in a calculation region. A controller 50 displays a detection result on a display unit 20, and ends the verification of the mask pattern in the selected calculation region.

In the case where the first to the third feature amounts do not satisfy the first to the third thresholds (step S51_No), the feature amount calculation circuit 54 detects such corresponding selected pattern as the critical point.

The processing of steps S17 and S18 is the same as that in FIG. 2 of the first embodiment.

A user may also change the first to the third thresholds (step S52). In the case where at least one of the first to the third thresholds is changed by the user (step S52_Yes), the controller 50 returns to step S51, and the determination of the first to the third feature amounts and the detection of the critical point are performed again based on the changed first to third thresholds. In the case where the first and the third thresholds are not changed by the user (step S52_No), the display state is maintained based on the selected first and the third thresholds.

The processing of step S21 is the same as that in FIG. 2 of the first embodiment.

6.2 Advantageous Effects of Present Embodiment

The configuration of the present embodiment achieves advantageous effects similar to those achieved by the fifth embodiment.

Furthermore, according to the configuration of the present embodiment, since the first to the third feature amounts are collectively determined, processing speed of the mask pattern verification can be improved.

7. Modifications, Etc

A mask pattern verification method, according to the present embodiment includes: calculating mask pattern data based on circuit pattern data and OPC processing; calculating an optical image and a resist image based on the mask pattern data; calculating a first feature amount regarding a first pattern of the resist image and a second feature amount regarding the first pattern and a second pattern that is adjacent to the first pattern respectively, using a plurality of algorithms; in each of the plurality of algorithms, comparing the first feature amount with a first threshold, and detecting a critical point, candidate in the first pattern; in each of the plurality of algorithms, comparing the second feature amount with a second threshold, and detecting a critical point in the first pattern; and selecting at least one of the plurality of algorithms, and displaying a detection result of the critical point corresponding to a selected algorithm.

By adopting the above embodiments, a mask pattern verification method capable of improving accuracy of the mask pattern verification can be provided.

It should be noted that the embodiments are not limited to the configurations described above, and can be modified in various ways.

For example, in the first embodiment, the determination of the first feature amount and the determination of the second feature amount may be performed collectively.

Furthermore, although the first embodiment presents an example of setting only in one direction line AA-AB, which is a virtual line for mask pattern verification, the direction of the virtual line can be set optionally. The determination of the first feature amount and the determination of the second feature amount may be performed respectively at a plurality of virtual lines rotated in a range of $0° \leq \theta < 180°$ with respect a certain resist image.

Figure 20:
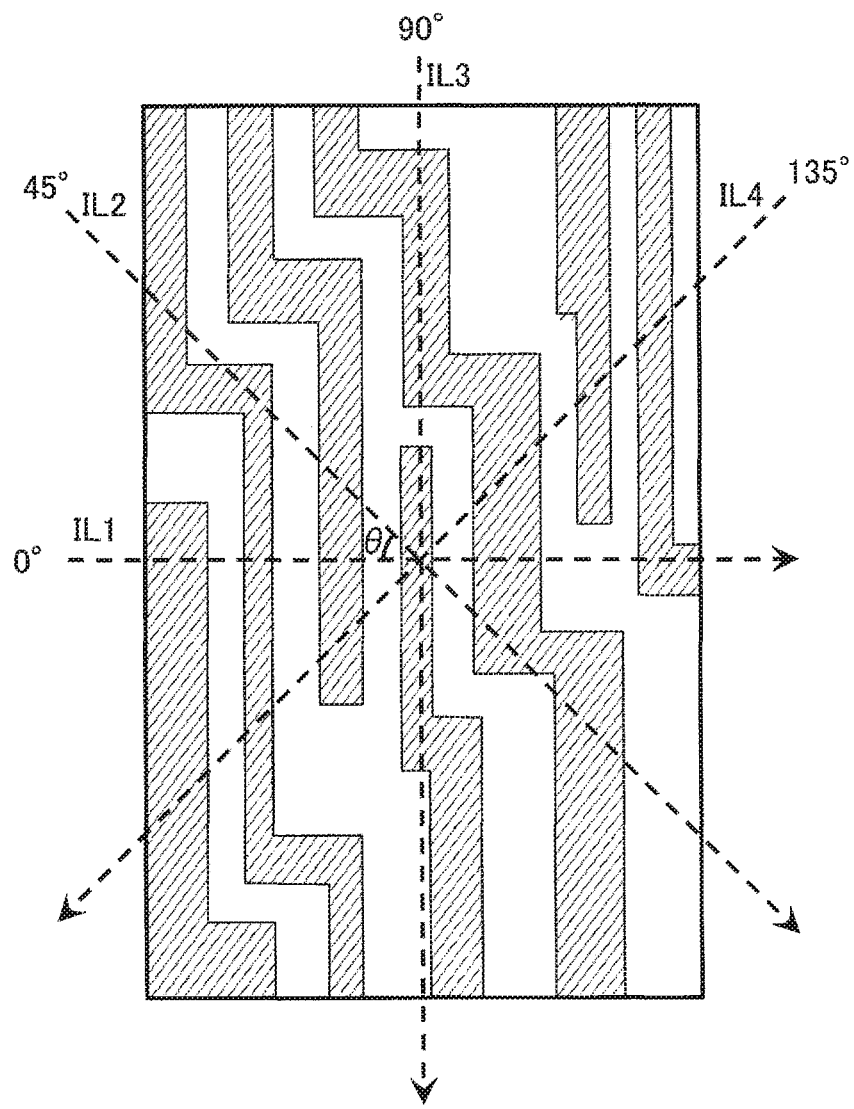
FIG. 20 is a diagram showing an example of performing verification of a mask pattern by defining a plurality of virtual lines.

For example, as shown in FIG. 20, a certain virtual line IL1 may be defined for the same resist image, and virtual lines IL2, IL3, and IL4 that are angled 45°, 90°, and 135° with respect thereto may be defined. As a result of performing determination using each of the virtual lines IL1, IL2, IL3, and IL4, in the case where there is an interconnect that is detected as a critical point regarding One of the virtual lines, this may be displayed on the display screen of the display unit 20. In this manner, an influence by a direction of the virtual line can be suppressed, and the determination accuracy can be further enhanced.

While certain embodiments have been described, these embodiments have been presented by way of example only, and are not intended to limit the scone of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A mask pattern verification method performed in a device including a processor, a memory, and a display, the method comprising:
   receiving circuit pattern data and optical proximity correction (OPC) condition data from an external device;
   storing the circuit pattern data and the OPC condition data in the memory;
   calculating, by the processor, mask pattern data based on OPC processing using the circuit pattern data and the OPC condition data;
   storing the mask pattern data in the memory;
   calculating, by the processor, an optical image and a resist image based on the mask pattern data;
   storing the optical image and the resist image in the memory;
   calculating, by the processor, a first feature amount regarding a first pattern of the resist image, using a plurality of algorithms;
   comparing, by the processor, the first feature amount with a first threshold in each of the plurality of algorithms, and detecting the first pattern as a critical point candidate based on a result of the comparison between the first feature amount and the first threshold in each of the plurality of algorithms;
   calculating, by the processor, a second feature amount based on a second pattern that is adjacent to the first pattern detected as the critical point candidate, using the plurality of algorithms;
   comparing, by the processor, the second feature amount with a second threshold, and detecting a critical point based on a result of the comparison between the second feature amount and the second threshold;
   selecting at least one of the plurality of algorithms; and
   displaying, on the display, a detection result of the critical point corresponding to a selected algorithm.

2. The method according to claim 1, wherein the plurality of algorithms include at least one of an algorithm based on a critical dimension (CD) value, an algorithm based on a normalized image log slope (NILS) value, an algorithm based on a peak intensity value of an optical image intensity distribution, and an algorithm based on an integrated intensity value of the optical image intensity distribution.

3. The method according to claim 1, wherein the second feature amount is an absolute value of a first feature amount regarding the second pattern.

4. The method according to claim 1, wherein the second feature amount is a magnitude of a difference between the first feature amount regarding the first pattern and a first feature amount regarding the second pattern.

5. The method according to claim 1, further comprising:
   calculating, by the processor, a third feature amount based on layouts of first the and the second patterns; and
   comparing, by the processor, the third feature amount with a third threshold, and detecting the critical point in the first pattern.

6. The method according to claim 5, wherein the third feature amount is based on at least one of a distance between the first pattern and the second pattern, a width of the second pattern, and a coverage rate of the second pattern with respect to the first pattern.

7. The method according to claim 1, wherein the critical point is detected from the critical point candidate.

8. The method according to claim 1, further comprising selecting at least one of the plurality of algorithms, and displaying, on the display, a detection result of the critical point candidate corresponding to a selected algorithm.

9. The method according to claim 1, further comprising revising the circuit pattern data and/or OPC data in order to eliminate the critical point.

10. The method according to claim 1, wherein when detecting the critical point candidate, in a case where the first feature amount is smaller than the first threshold, detecting the first pattern as the critical point candidate.

11. The method according to claim 1, wherein when detecting the critical point, in a case where the second feature amount is equal to or greater than the second threshold, detecting the first pattern as the critical point.

12. The method according to claim 1, wherein displaying the detection result of the critical point includes simultaneously displaying a display window of the resist image on which the critical point is shown, and a selection window of the plurality of algorithms.

13. The method according to claim 1, wherein displaying the detection result of the critical point includes simultaneously displaying a display window of the resist image on which the critical point is shown, a selection window of the plurality of algorithms, and a setting display window of the second threshold.

14. The method according to claim 1, wherein the second feature amount is based on layouts of the first and the second patterns.

15. The method according to claim 14, wherein the second feature amount is based on at least one of a distance between the first pattern and the second pattern, a width of the second pattern, and a coverage rate of the second pattern with respect to the first pattern.

16. The method according to claim 1, further comprising:
correcting at least one of the circuit pattern data and the OPC condition data; and
transmitting the corrected circuit pattern data and OPC condition data to the external device.

* * * * *